(12) United States Patent
Krishnamurthi

(10) Patent No.: US 11,025,201 B2
(45) Date of Patent: Jun. 1, 2021

(54) POWER EFFICIENT RADIO MIXERS

(71) Applicant: BAE Systems Information and Electronic Systems Integration Inc., Nashua, NH (US)

(72) Inventor: Kathiravan Krishnamurthi, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 364 days.

(21) Appl. No.: 16/082,577

(22) PCT Filed: Feb. 28, 2018

(86) PCT No.: PCT/US2018/020143
§ 371 (c)(1),
(2) Date: Sep. 6, 2018

(87) PCT Pub. No.: WO2019/168514
PCT Pub. Date: Sep. 6, 2019

(65) Prior Publication Data
US 2020/0382058 A1    Dec. 3, 2020

(51) Int. Cl.
*H04B 1/16* (2006.01)
*H03D 7/16* (2006.01)
(Continued)

(52) U.S. Cl.
CPC ......... *H03D 7/1425* (2013.01); *H03D 7/1433* (2013.01); *H03D 7/1458* (2013.01); *H03F 3/19* (2013.01); *H04B 1/16* (2013.01); *H03D 2200/0023* (2013.01); *H03D 2200/0025* (2013.01); *H03D 2200/0084* (2013.01); *H03F 2200/451* (2013.01)

(58) Field of Classification Search
CPC ......... H03D 7/1325; H03D 2200/0025; H03D 2200/0084; H04B 1/16
See application file for complete search history.

(56) References Cited

U.S. PATENT DOCUMENTS 6,026,286 A    2/2000  Long
6,157,822 A    12/2000 Bastani et al.
(Continued)

OTHER PUBLICATIONS

International Search Report, Written Opinion of the International Searching Authority, 8 pages, dated May 17, 2018.

*Primary Examiner* — Dinh T Le
(74) *Attorney, Agent, or Firm* — Scott J. Asmus; Sand, Sebolt & Wernow LPA

(57) ABSTRACT

Embodiments of power efficient radio mixers are provided. A generalized impedance matched low-voltage active mixer circuit technique, which utilizes a plurality of commutator cells and transformers, is disclosed. The low voltage active mixer function is coupled to an impedance matched amplifier allowing for insertion of image rejection filtering between the amplifier and the mixing function. The commutator cells can be driven in parallel by common local oscillator (LO) and intermediate frequency (IF) ports combined in parallel to yield highly linear mixers. A multi-channel receiver with a common impedance matched radio frequency (RF) amplifier driving a plurality of commutator cells with multiple LOs and IFs is also disclosed.

17 Claims, 11 Drawing Sheets

(51) Int. Cl.
    *H03D 7/14*         (2006.01)
    *H03F 3/19*         (2006.01)

(56) References Cited

U.S. PATENT DOCUMENTS

| | | | |
|---:|---|---|---|
| 6,807,407 B2 * | 10/2004 | Ji | H04B 1/26 |
| 6,819,914 B2 * | 11/2004 | Yan et al. | H04B 1/26 |
| 9,413,800 B2 * | 8/2016 | Cho | H04W 36/14 |
| 10,581,381 B2 * | 3/2020 | Krishnamurthi | H03D 7/1433 |
| 2003/0078026 A1 | 4/2003 | Monge | |
| 2003/0199259 A1 | 10/2003 | Macedo et al. | |
| 2005/0118979 A1 | 6/2005 | Langenberg et al. | |

\* cited by examiner

POWER EFFICIENT RADIO MIXERS

BACKGROUND

Technical Field

The present disclosure relates to systems and methods for communication systems. More particularly, the present disclosure relates to radio frequency (RF) mixers. Specifically, the present disclosure relates to power efficient RF mixers with improved power gain and dynamic range.

Background Information

Generally, radio frequency (RF) is any frequency within the electromagnetic spectrum associated with radio wave propagation. Typically, applying an RF current to an antenna creates an electromagnetic field that is able to propagate through space. One exemplary wireless technology that utilizes RF field propagation includes RF mixers.

Generally, an RF mixer is an electronic device used in radio receivers and transmitters to convert the frequency of an input signal. Generally, there are active RF mixers and passive RF mixers.

One exemplary active RF mixer is a Gilbert cell mixer which typically utilizes bipolar transistors to operate as a precision multiplier and is typically used in modern communication systems as a mixer and frequency translator. However, for many RF applications, the Gilbert cell mixer typically suffers from higher noise and lower power gain compared to a passive RF mixer followed by an intermediate frequency (IF) amplifier. One exemplary shortcoming of the Gilbert cell mixer is the impedance mismatch of the transconductor to the quad core where the transconductor is loaded by low impedance of the quad core. Other exemplary shortcomings associated with the Gilbert cell mixer, include, inter alia, that the Gilbert cell mixer typically has noise figures of eight to ten decibels (dB) for high linearity applications and the image noise present at the transconductor output is typically present in the band of interest after mixing which increases the noise level of the Gilbert cell mixer.

SUMMARY

There remains a need in the art for an improved RF mixer. The present disclosure addresses these and other issues.

In one aspect, the present disclosure may provide an RF mixer apparatus comprising a plurality of transformers. Each of the plurality of transformers includes a primary and a secondary and each primary is connected in series. The RF mixer apparatus further includes a radio frequency (RF) port and a plurality of commutator cells. Each of the plurality of commutator cells is coupled to a local oscillator (LO) port in parallel and an intermediate frequency (IF) port in parallel. Each secondary is connected across one commutator cell of the plurality of commutator cells.

In one example, the plurality of transformers are 1:1 transformers. The RF mixer apparatus may further include a plurality of current sources providing a total commutator cell current to the plurality of commutator cells. In one example, the total commutator cell current is split substantially equally between the plurality of commutator cells. The RF mixer apparatus may further include a total commutator cell impedance presented by the plurality of commutator cells and an RF source impedance presented to the RF port. In one example, the total commutator cell impedance is substantially matched to the RF source impedance.

The RF mixer apparatus may further include an amplifier mechanism connected across the series connection of the primaries of the plurality of transformers. The RF mixer apparatus may further include an output impedance presented by the amplifier mechanism. In one example, the total commutator cell impedance substantially matches the output impedance of the amplifier mechanism.

In one example, the RF mixer apparatus may further include a primary tap and a voltage supply connected to the primary tap to provide a voltage to the amplifier mechanism.

In one example, the RF mixer apparatus may further include a center-tapped secondary of each of the plurality of transformers and a primary tap. Each center-tapped secondary of the plurality of transformers is connected to the primary tap to supply a voltage to the amplifier mechanism. The amplifier mechanism reuses the total commutator cell current through the primary tap.

The RF mixer apparatus may further include a filter mechanism connected to the plurality of commutator cells and the amplifier mechanism. In one example, the amplifier mechanism is a series-shunt feedback amplifier configured to provide a variable gain.

In another aspect, the present disclosure may provide an RF mixer apparatus comprising a plurality of transformers. Each of the plurality of transformers includes a primary and a secondary and each primary is connected in series. The RF mixer apparatus may further include a plurality of commutator cells. Each of the plurality of commutator cells is respectively coupled to a local oscillator (LO) port. Each of the plurality of commutator cells is respectively coupled to an intermediate frequency (IF) port. Each secondary is connected across one commutator cell of the plurality of commutator cells. Each secondary is connected across one commutator cell of the plurality of commutator cells. The RF mixer apparatus may further include a plurality of IF filter mechanisms respectively connected between each of the plurality of commutator cells and each of the respective IF ports. The RF mixer apparatus may further include an amplifier mechanism connected across the series connection of the primaries of the plurality of transformers. In one example, the plurality of transformers are 1:1 transformers.

The RF mixer apparatus may further include a filter mechanism connected to the plurality of commutator cells and the amplifier mechanism. In one example, the amplifier mechanism is a series-shunt feedback amplifier configured to provide a variable gain.

The RF mixer apparatus may further include at least one current source providing a total commutator cell current to the plurality of commutator cells. In one example, the total commutator cell current is split substantially equally between the plurality of commutator cells.

The RF mixer apparatus may further include a center-tapped secondary of each of the plurality of transformers and a primary tap. Each center-tapped secondary of the plurality of transformers is connected to the primary tap to supply a voltage to the amplifier mechanism. The amplifier mechanism reuses the total commutator cell current through the primary tap.

The RF mixer apparatus may further include a total commutator cell impedance presented by the plurality of commutator cells and an RF source impedance presented to the RF port. The total commutator cell impedance is substantially matched to the RF source impedance.

The RF mixer apparatus may further include a total commutator cell impedance presented by the plurality of commutator cells and an output impedance presented by the amplifier mechanism. The total commutator cell impedance substantially matches the output impedance.

In another aspect, the present disclosure may provide embodiments of power efficient radio mixers. A generalized impedance matched low-voltage active mixer circuit technique, which utilizes a plurality of commutator cells and transformers, is disclosed. The low voltage active mixer function is coupled to an impedance matched amplifier for insertion of image rejection filtering between the amplifier and the mixing function. The commutator cells can be driven in parallel by common local oscillator (LO) and intermediate frequency (IF) ports combined in parallel to yield highly linear mixers. A multi-channel receiver with a common impedance matched radio frequency (RF) amplifier driving a plurality of commutator cells with multiple LOs and IFs is also disclosed.

BRIEF DESCRIPTION OF THE SEVERAL VIEWS OF THE DRAWINGS

Sample embodiments of the present disclosure are set forth in the following description, is shown in the drawings and is particularly and distinctly pointed out and set forth in the appended claims.

Similar numbers refer to similar parts throughout the drawings.

DETAILED DESCRIPTION

Figure 1:
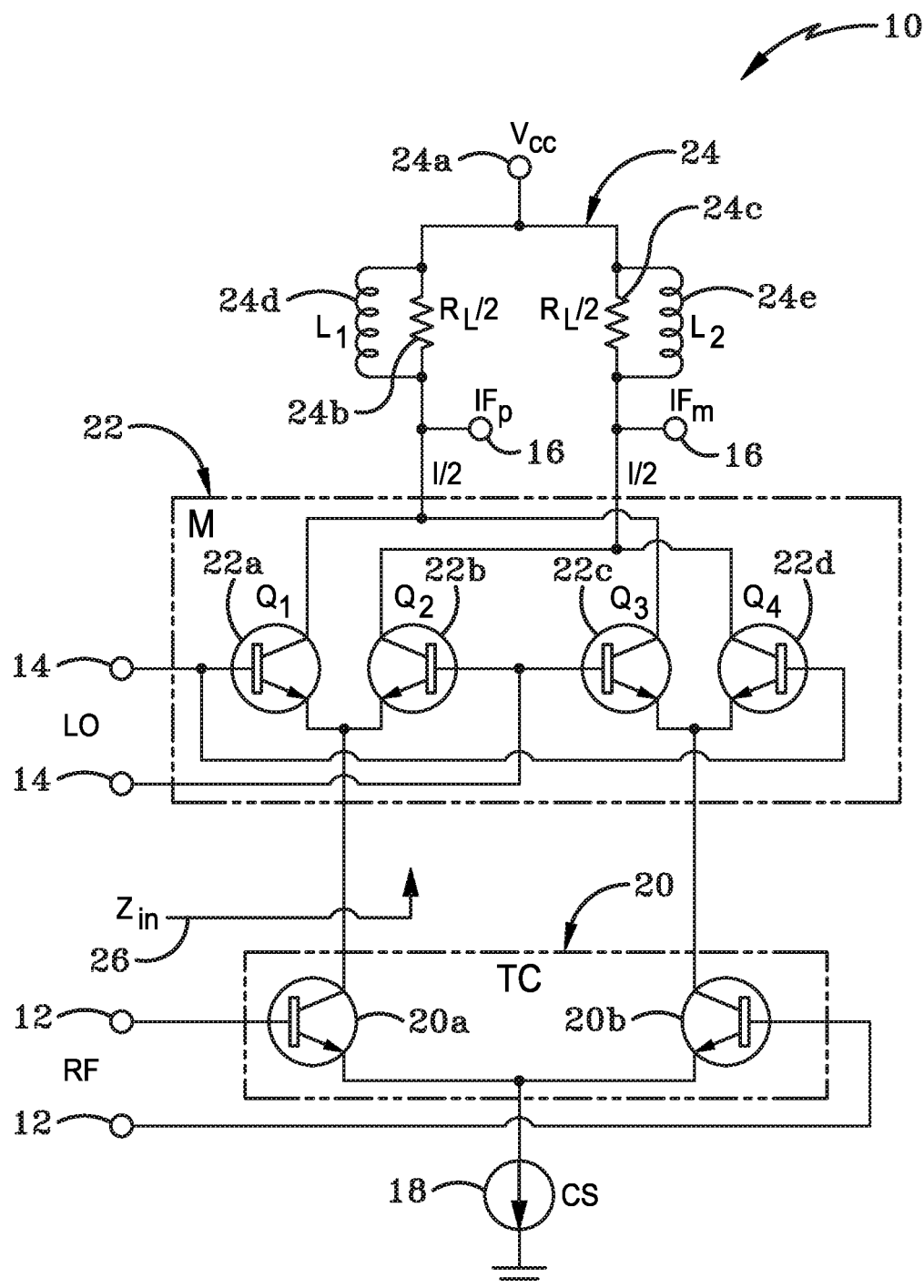
FIG. 1 is a schematic diagram of a PRIOR ART Gilbert cell mixer.

FIG. 1 illustrates a schematic view of a PRIOR ART Gilbert cell mixer 10 which includes a differential voltage radio frequency (RF) input terminal 12, a differential voltage local oscillator (LO) input terminal 14, a differential voltage intermediate frequency (IF) terminal 16, a current source 18, a transconductor 20, a mixing mechanism 22, which may also be referred to as a switching core, commutating quad, mixer core, commutator cell, mixing quad or quad core, and a load mechanism 24.

The transconductor 20 includes a first transistor 20a and a second transistor 20b. The mixing mechanism 22 includes a first transistor 22a, a second transistor 22b, a third transistor 22c and a fourth transistor 22d. The load mechanism 24 includes a voltage supply 24a, a first resistor 24b, a second resistor 24c, a first pull-up inductor 24d and a second pull up inductor 24e.

The base of the first transistor 20a is connected to one of the RF input terminals 12 and the base of the second transistor 20b is connected to the other RF input terminal 12. The emitter of the first transistor 20a is connected to the current source 18 and the emitter of the second transistor 20b. The emitter of the second transistor 20b is connected to the current source 18. The collector of the first transistor 20a is connected to the emitters of the first transistor 22a and the second transistor 22b. The collector of the second transistor 20a is connected to the emitter of the third transistor 22c and the fourth transistor 22d. The first transistor 22a and the second transistor 22b are a cross-coupled pair of transistors. The emitter of the first transistor 22a is connected to the emitter of the second transistor 22b. The third transistor 22c and the fourth transistor 22d are a cross-coupled pair of transistors. The emitter of the third transistor 22c is connected to the emitter of the fourth transistor 22d. The base of the first transistor 22a is connected to the base of the fourth transistor 22d and to one of the LO input terminals 14. The base of the second transistor 22b is connected to the base of the third transistor 22c and the other of the LO input terminals 14. The collector of the first transistor 22a is connected to the collector of the third transistor 22c and to one of the IF output terminals 16. The collector of the second transistor 22b is connected to the collector of the fourth transistor 22d and to the other of the IF output terminals 16. The first resistor 24b and the first pull-up inductor 24d are connected to one of the IF output terminals 16 and the voltage supply 24a. The second resistor 24c and the second pull-up inductor 24e are connected to the other of the IF output terminals 16 and the voltage supply 24a. The PRIOR ART Gilbert cell mixer 10 shows a mixer core impedance 26, or $Z_{in}$, looking into the mixing mechanism 22 and seen by the transconductor 20 across its output terminals.

The operation of the Gilbert cell mixer 10 is well known and, for brevity purposes, will not be discussed herein; however, and as stated in the Background above, the Gilbert cell mixer 10 has some shortcomings.

Figure 2:
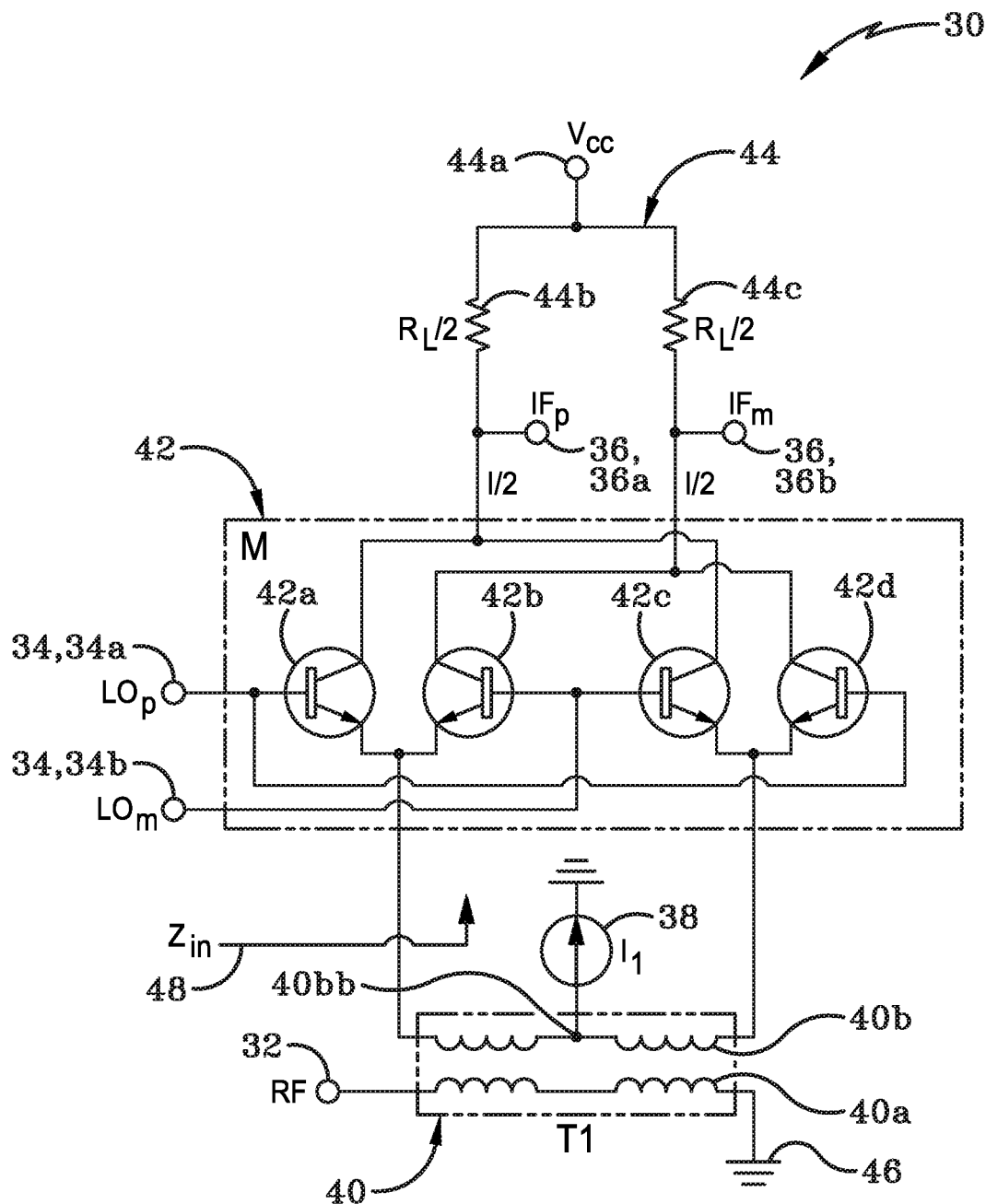
FIG. 2 is a schematic diagram of a PRIOR ART low voltage active RF mixer.

FIG. 2 illustrates a schematic view of a PRIOR ART low voltage active RF mixer 30. The PRIOR ART low voltage active RF mixer 30 removes the transconductor 20 of the PRIOR ART Gilbert Cell mixer 10 while still utilizing the switching core 22 of the PRIOR ART Gilbert Cell mixer 10. Specifically, the PRIOR ART low voltage active RF mixer 30 includes a single-ended RF input terminal 32, a differential voltage LO input terminal 34 having a first LO input terminal 34a and a second LO input terminal 34b, a differential voltage IF output terminal 36 having a first IF output terminal 36a and a second IF output terminal 36b, a current source 38, a transformer 40, a mixing mechanism 42, which may also be referred to as a switching core, mixer core, commutating quad, commutator cell, mixing quad or quad core, a load mechanism 44 and a ground 46.

The transformer 40 includes a primary 40a and a secondary 40b which includes a center tap 40bb. The mixing mechanism 42 includes a first transistor 42a, a second transistor 42b, a third transistor 42c and a fourth transistor 42d. The load mechanism 44 includes a voltage supply 44a, a first resistor 44b and a second resistor 44c.

The primary 40a of the transformer 40 is connected to the RF input terminal 32 and the ground 46. The secondary 40b of the transformer 40 is connected to the emitters of the first transistor 42a, the second transistor 42b, the third transistor 42c and the fourth transistor 42d and the current source 38 via center tap 40bb. The first transistor 42a and the second transistor 42b are a cross-coupled pair of transistors. The emitter of the first transistor 42a is connected to the emitter of the second transistor 42b. The third transistor 42c and the fourth transistor 42d are a cross-coupled pair of transistors. The emitter of the third transistor 42c is connected to the emitter of the fourth transistor 42d. The base of the first transistor 42a is connected to the base of the fourth transistor 42d and to the first LO input terminal 34a. The base of the second transistor 42b is connected to the base of the third transistor 42c and to the second LO input terminal 34b. The collector of the first transistor 42a is connected to the collector of the third transistor 42c and to the first IF output terminal 36a. The collector of the second transistor 42b is connected to the collector of the fourth transistor 42d and to the second IF output terminal 36b. The first resistor 44b is connected to the first IF output terminal 36a and the voltage supply 44a. The second resistor 44c is connected to the second IF output terminal 36b and the voltage supply 44a. The low voltage active RF mixer 30 further shows a mixing mechanism impedance 48, or $Z_{in}$, looking into the mixing mechanism 42 and seen by the transformer 40 across its output terminals.

In operation, an RF input signal (not shown) is split by the transformer 40 and fed to the mixer core 42 which is driven by the LO input terminal 34. In this embodiment, the transformer 40 is a 1:1 planar transformer (which is a transformer that has a ratio of 1 to 1 between the primary and secondary windings). The center tap 40bb of the secondary 40b of the transformer 40 is used to connect a tail current source $I_1$ to be provided to the mixer core 42. The RF input signal is then down-converted to a desired IF. In one exemplary embodiment, the PRIOR ART low voltage active RF mixer 30 was operated with a 3 milliamp (mA) and a 2.0 volt (V) voltage supply. When the PRIOR ART low voltage active RF mixer 30 is operated at this level of direct current (DC), the input impedance at the RF input terminal 32 is approximately 50 ohms (Ω). As stated above, a 1:1 planar transformer is used to couple the input power to the mixer core 42. Further, when the PRIOR ART low voltage active RF mixer 30 is operated at 3 mA of DC, the PRIOR ART low voltage active RF mixer 30 has an 11 decibel (dB) noise figure, a 2.5 decibel-milliwatts (dBm) input power level (IIP3) and a 6.0 dB gain.

Figure 3:
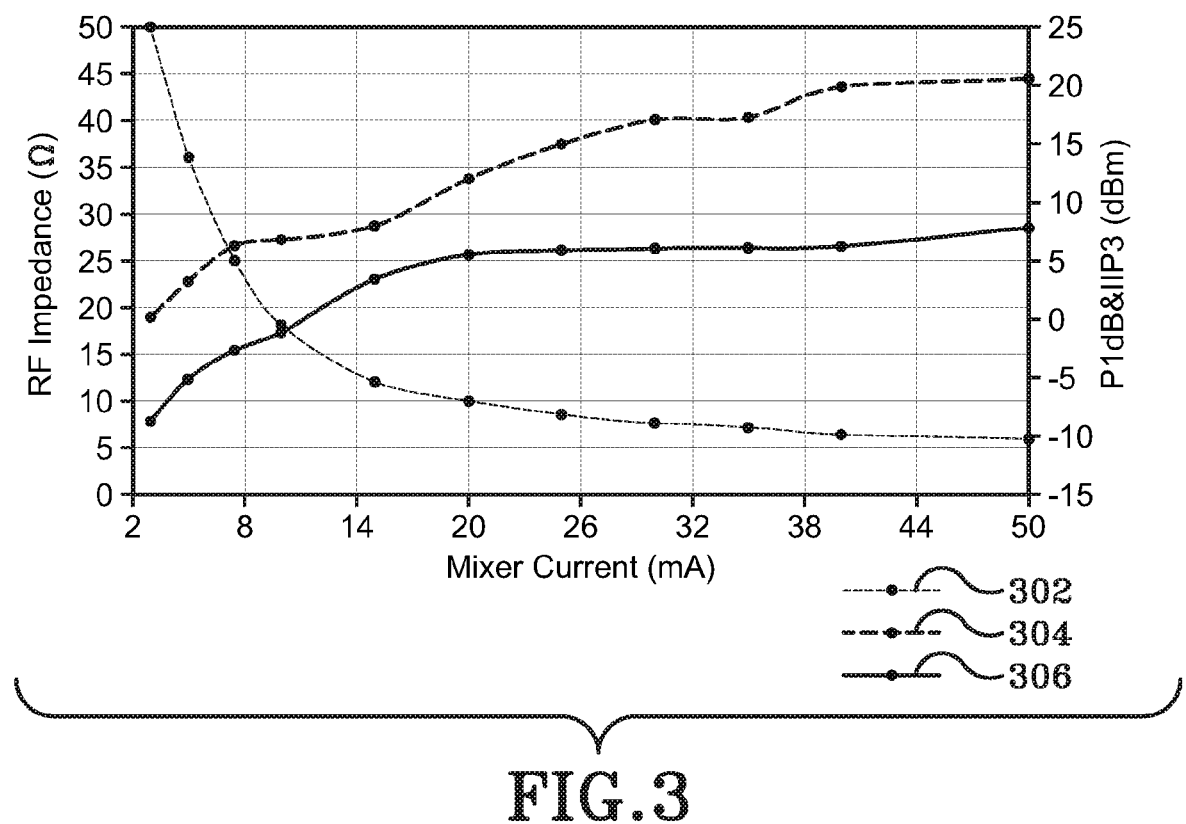
FIG. 3 is a graph of RF impedance and power handling as a function of DC for a low voltage bipolar junction transistor quad mixer.

One drawback associated with the PRIOR ART low voltage active RF mixer 30 is its limited power handling ability as shown in FIG. 3. FIG. 3 is a graph of RF impedance and power handling as a function of DC for a low voltage bipolar junction transistor quad RF mixer which encompasses the PRIOR ART RF mixers 10, 30 and 50 (below) as well as the embodiments of the RF mixers of the present disclosure (below). The left y-axis is RF impedance in Ω, the right y-axis is 1 dB compression point (P1 dB) in dBm and input power level (IIP3) in dBm and the x-axis is mixer current in mA. Line 302 represents the RF impedance, line 304 represents the IIP3, and line 306 represents P1 dB. As shown in FIG. 3, as the mixer current increases, the RF impedance of the mixer core decreases according to:

$$z_{in} = \frac{2\pi(0.026)}{I_{DC}}. \quad \text{Equation (1)}$$

As shown in FIG. 3, the RF impedance of the PRIOR ART low voltage active RF mixer 30 is 50 at 3 mA and decreases as the mixer current increases. As shown in FIG. 3, the RF impedance can be as low as 6 (including transformer loss) at 50 mA DC when the PRIOR ART low voltage active RF mixer 30 yields 20 dBm IIP3.

Figure 4:
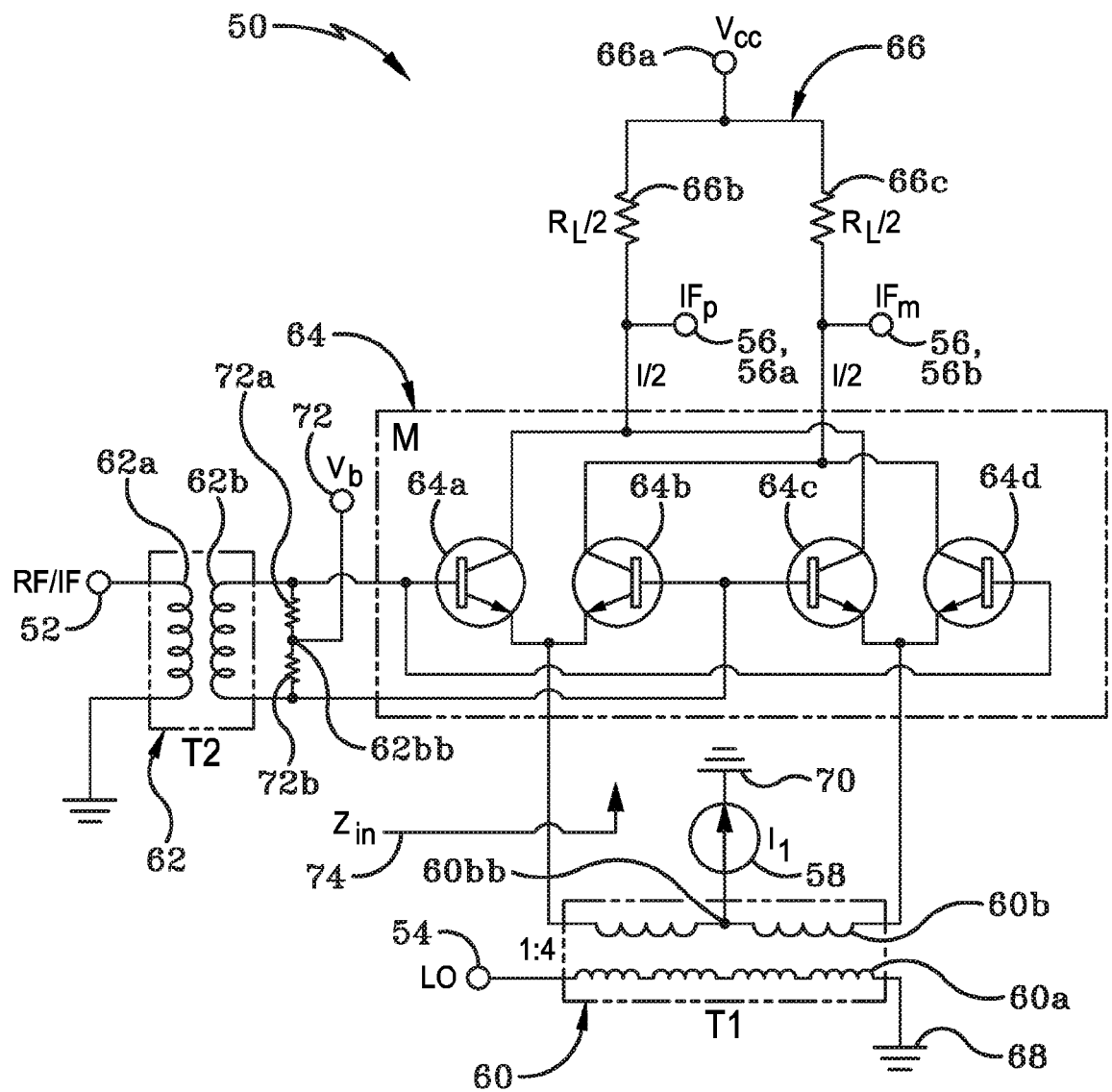
FIG. 4 is a schematic diagram of a PRIOR ART low voltage active RF mixer.

FIG. 4 illustrates a schematic view of a PRIOR ART low voltage active RF mixer 50. The PRIOR ART low voltage active RF mixer 50 is substantially identical to the PRIOR ART low voltage active RF mixer 30 in structure and function with a few exceptions/additions that will be discussed hereafter in greater detail. The PRIOR ART low voltage active RF mixer 50 was designed for 2.5 gigahertz (GHz) low-voltage mobile phone applications and the mixer quad is driven by the emitter side and the RF input signal is fed to the base terminals of the mixer quad as more fully described below. Specifically, PRIOR ART low voltage active RF mixer 50 includes a single-ended RF input terminal 52, a single-ended local oscillator (LO) input terminal 54, a differential voltage IF output terminal 56 having a first IF output terminal 56a and a second IF output terminal 56b, a current source 58, a first transformer 60, a second transformer 62, a mixing mechanism 64, which may also be referred to as a switching core, mixer core, commutating quad, commutator cell, mixing quad or quad core, a load mechanism 66, a first ground 68, a second ground 70 and a voltage bias circuit 72.

The first transformer 60 includes a primary 60a and a secondary 60b. The second transformer 62 includes a primary 62a and a secondary 62b which includes a center tap 62bb. The mixing mechanism 64 includes a first transistor 64a, a second transistor 64b, a third transistor 64c and a fourth transistor 64d. The load mechanism 66 includes a voltage supply 66a, a first resistor 66b and a second resistor 66c. The voltage bias circuit 72 includes a first resistor 72a and a second resistor 72b.

The primary 60a of the first transformer 60 is connected to the RF input terminal 52 and the first ground 68. The secondary 60b of the first transformer 60 is connected the base of the first transistor 64a, the base of the second transistor 64b, the base of the third transistor 64c, the first resistor 72a and the second resistor 72b. The primary 62a of the second transformer 62 is connected to the LO input terminal 54 and the second ground 70. The secondary 62b of the second transformer 62 is connected to the emitters of the first transistor 64a, the second transistor 64b, the third transistor 64c and the fourth transistor 64d and the current source 58 via center tap 62bb. The voltage bias circuit 72 is connected midway between the first resistor 72a and the second resistor 72b. The first resistor 72a is connected to the base of the first transistor 64a and the secondary 60b of the first transformer 60. The second resistor 72b is connected to the base of the second transistor 64b, the base of the third transistor 64c and the secondary 60b of the first transformer 60. The first transistor 64a and the second transistor 64b are a cross-coupled pair of transistors. The emitter of the first transistor 64a is connected to the emitter of the second transistor 64b. The third transistor 64c and the fourth transistor 64d are a cross-coupled pair of transistors. The emitter of the third transistor 64c is connected to the emitter of the fourth transistor 64d. The base of the first transistor 64a is connected to the base of the fourth transistor 64d and to the single-ended RF input terminal 52. The base of the second transistor 64b is connected to the base of the third transistor 64c and to the single-ended RF input terminal 52. The collector of the first transistor 64a is connected to the collector of the third transistor 64c and to the first IF output terminal 56a. The collector of the second transistor 64b is connected to the collector of the fourth transistor 64d and to the second IF output terminal 56b. The first resistor 66b is connected to the first IF output terminal 56a and the voltage supply 66a. The second resistor 66c is connected to the second IF output terminal 56b and the voltage supply 66a. The low voltage active RF mixer 50 further includes a mixing mechanism impedance 74, or $Z_{in}$, looking into the mixing mechanism 64 and seen by the single-ended LO input terminal 54.

In operation, an RF input signal (not shown) is fed to the mixer core 64 (i.e. at the bases of the first transistor 64a, second transistor 64b, third transistor 64c and the fourth transistor 64d) which is driven by the LO input terminal 34 (i.e. at the emitters of the first transistor 64a, second transistor 64b, third transistor 64c and the fourth transistor 64d). In this embodiment, the transformer 60 is a 1:4 planar transformer. The center tap 60bb of the secondary 60b of the transformer 60 is used to connect a tail current source $I_1$ to be provided to the mixer core 64. The RF input signal is then down-converted to a desired IF. In one exemplary embodiment, the PRIOR ART low voltage active RF mixer 50 was operated with a 15 mA current with a 2.75 V voltage supply. When the PRIOR ART low voltage active RF mixer 50 is operated at this level of DC, the input impedance at the LO terminal input terminal 54 is low (i.e. approximately 12Ω). Further, when the PRIOR ART low voltage active RF mixer 50 is operated at this level of DC, the PRIOR ART low voltage active RF mixer 50 has a 7.5 dB noise figure, a 2.5 dBm IIP3 and a 14.0 dB gain. As stated above, the low impedance seen by the LO input terminal 54 port requires the driver of the mixer core 64 to handle a 1:4 (i.e. 12 Ω: 48Ω) impedance transformation. Further, the driver consumes 17.5 mA with a 2.75 V supply. Any increase of DC through the mixer core 64 to achieve a higher IIP3 will result in larger transformation ratios for impedance transformation at the drive port (i.e. LO input terminal 54) as shown in the graph of FIG. 3. In other words, a lower impedance seen by the LO input terminal 54 results in a higher driver current requirement.

Figure 5:
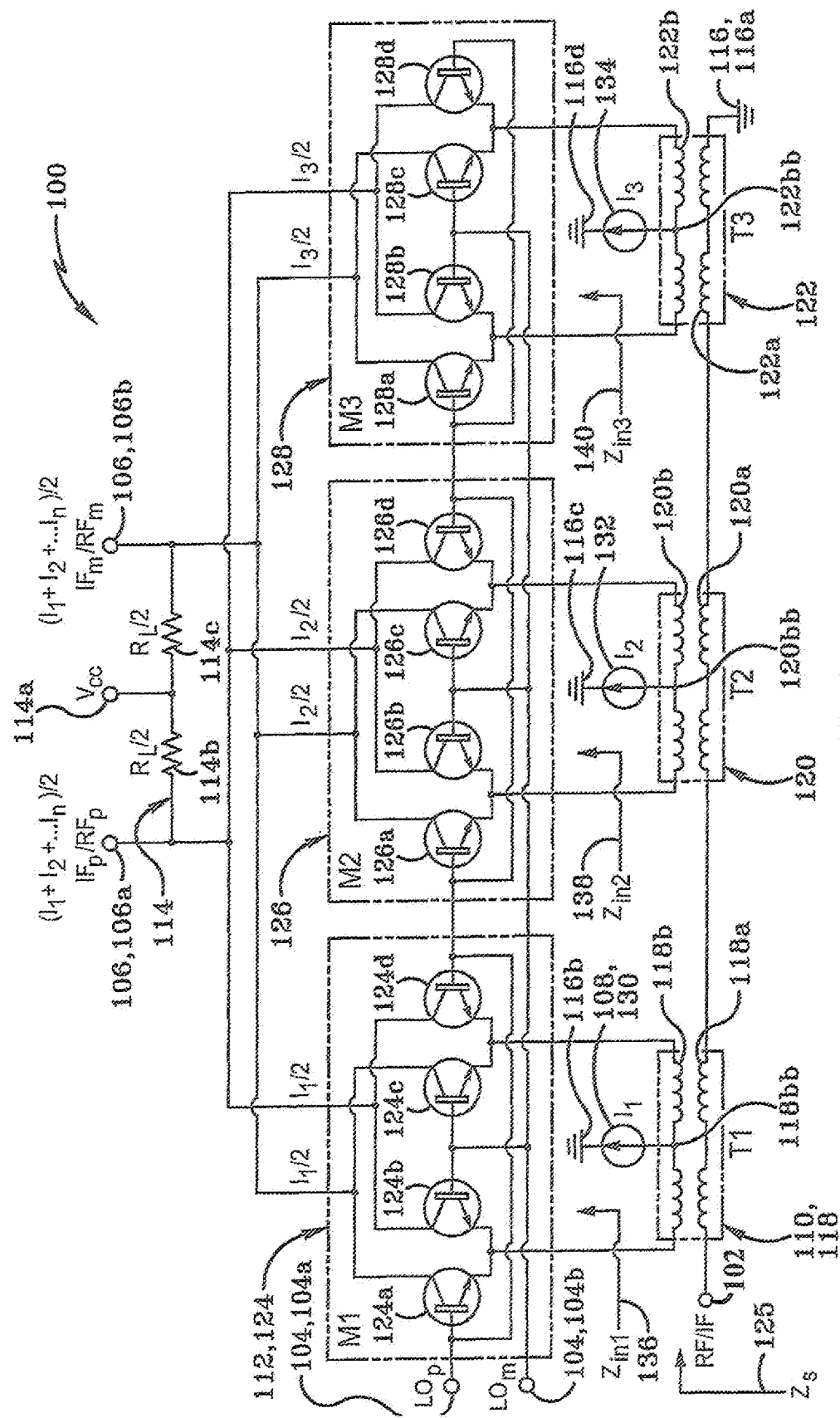
FIG. 5 is a schematic diagram of one embodiment of an active RF mixer apparatus in accordance with one aspect of the present disclosure.

FIG. 5 is a schematic view of one embodiment of an active RF mixer apparatus 100 in accordance with one aspect of the present disclosure. The active RF mixer apparatus 100 may include a single-ended RF input terminal 102, a differential voltage LO input terminal 104 having a first LO input terminal 104a and a second LO input terminal 104b, a differential IF output terminal 106 having a first IF output terminal 106a and a second IF output terminal 106b, at least two current sources 108, at least two transformers 110, at least two mixing mechanisms 112, which may also be referred to as commutator switching cores, mixer cores, commutating quads, mixing quads or quad cores, a load mechanism 114 and at least one ground 116.

In one particular embodiment, the RF mixer apparatus 100 may include a first ground 116a, a second ground 116b, a third ground 116c and a fourth ground 116d.

In one particular embodiment, the active RF mixer apparatus 100 may include a first transformer 118, a second transformer 120 and a third transformer 122. The first transformer 118 may include a primary 118a and a secondary 118b which includes a center tap 118bb. The second transformer 120 may include a primary 120a and a secondary 120b which includes a center tap 120bb. The third transformer 122 may include a primary 122a and a secondary 122b which includes a center tap 122bb. In one example, the first transformer 118, the second transformer 120 and the third transformer 122 are 1:1 planar transformers; however, any suitable transformers may be utilized.

In one particular embodiment, the active RF mixer apparatus 100 may include a first commutator cell 124, a second commutator cell 126 and a third commutator cell 128. The first commutator cell 124 may include a first transistor 124a, a second transistor 124b, a third transistor 124c and a fourth transistor 124d. The second commutator cell 126 may include a first transistor 126a, a second transistor 126b, a third transistor 126c and a fourth transistor 126d. The third commutator cell 128 may include a first transistor 128a, a second transistor 128b, a third transistor 128c and a fourth transistor 128d. In one example, the first commutator cell 124, the second commutator cell 126 and the third commutator cell 128 may be a bipolar junction transistor mixer; however the first commutator cell 124, the second commutator cell 126 and the third commutator cell 128 may be any suitable mixing mechanism. Further, the first commutator cell 124, the second commutator cell 126 and the third commutator cell 128 may utilize any suitable transistors including, but not limited to, bipolar transistors, n-type field effect transistors (nFETs), pseudomorphic high-electron mobility transistors (pHEMTs), metal-semiconductor field-effect transistors (MESFETs) and gallium nitride (GaN) transistors.

The load mechanism 114 may include a voltage supply 114a, a first resistor 114b and a second resistor 114c. Although not shown, it is envisioned that the load mechanism 114 may further include a first pull-up inductor and a second pull-up inductor.

In one particular embodiment, the active RF mixer apparatus 100 may include a first current source 130, a second current source 132 and a third current source 134.

In one example, the primary 118a of the first transformer 118 is connected to the RF input terminal 102 and the primary 120a of the second transformer 120 in series. The primary 120a of the second transformer 120 is connected to the primary 122a of the third transformer 122 in series. The primary of the third transformer 122a is connected to the first ground 116a.

The secondary 118b of the first transformer 118 is connected to the emitters of the first transistor 124a, the second transistor 124b, the third transistor 124c and the fourth transistor 124d of the first commutator cell 124 and the first current source 130 via center tap 118bb. The first current source 130 is connected to the second ground 116b. The first transistor 124a and the second transistor 124b are a cross-coupled pair of transistors. The emitter of the first transistor 124a is connected to the emitter of the second transistor 124b. The third transistor 124c and the fourth transistor 124d are a cross-coupled pair of transistors. The emitter of the third transistor 124c is connected to the emitter of the fourth transistor 124d. The base of the first transistor 124a is connected to the base of the fourth transistor 124d and to the first LO input terminal 104a. The base of the second transistor 124b is connected to the base of the third transistor 124c and to the second LO input terminal 104b. The collector of the first transistor 124a is connected to the collector of the third transistor 124c and to the first IF output terminal 106a. The collector of the second transistor 124b is connected to the collector of the fourth transistor 124d and to the second IF output terminal 106b. The first resistor 114b is connected to the first IF output terminal 106a and the voltage supply 114a. The second resistor 114c is connected to the second IF output terminal 106bb and the voltage supply 114a. The active RF mixer apparatus 100 further shows a first commutator cell impedance 136, or $Z_{in1}$, looking into the first commutator cell 124 and seen by the first transformer 118, which is a 1:1 transformer, across its primary 118a terminals.

The secondary 120b of the second transformer 120 is connected to the emitters of the first transistor 126a, the second transistor 126b, the third transistor 126c and the fourth transistor 126d of the second commutator cell 126 and the first current source 132 via center tap 120bb. The second current source 132 is connected to third ground 116c. The first transistor 126a and the second transistor 126b are a cross-coupled pair of transistors. The emitter of the first transistor 126a is connected to the emitter of the second transistor 126b. The third transistor 126c and the fourth transistor 126d are a cross-coupled pair of transistors. The emitter of the third transistor 126c is connected to the emitter of the fourth transistor 126d. The base of the first transistor 126a is connected to the base of the fourth transistor 126d and to the first LO input terminal 104a in parallel. The base of the second transistor 126b is connected to the base of the third transistor 126c and to the second LO input terminal 104b in parallel. The collector of the first transistor 126a is connected to the collector of the third transistor 126c and to the first IF output terminal 106a in parallel. The collector of the second transistor 126b is connected to the collector of the fourth transistor 126d and to the second IF output terminal 106b in parallel. The active RF mixer apparatus 100 further shows a second commutator cell impedance 138, or $Z_{in2}$, looking into the second commutator cell 126 and seen by the second transformer 120, which is a 1:1 transformer, across its primary 120a terminals.

The secondary 122b of the second transformer 122 is connected to the emitters of the first transistor 128a, the second transistor 128b, the third transistor 128c and the fourth transistor 128d of the third commutator cell 128 and the third current source 134 via center tap 122bb. The third current source 134 is connected to the fourth ground 116d. The first transistor 128a and the second transistor 128b are a cross-coupled pair of transistors. The emitter of the first transistor 128a is connected to the emitter of the second transistor 128b. The third transistor 128c and the fourth transistor 128d are a cross-coupled pair of transistors. The emitter of the third transistor 128c is connected to the emitter of the fourth transistor 128d. The base of the first transistor 128a is connected to the base of the fourth transistor 128d and to the first LO input terminal 104a in parallel. The base of the second transistor 128b is connected to the base of the third transistor 128c and to the second LO input terminal 104b in parallel. The collector of the first transistor 128a is connected to the collector of the third transistor 128c and to the first IF output terminal 106a in parallel. The collector of the second transistor 128b is connected to the collector of the fourth transistor 128d and to the second IF output terminal 106b in parallel. The active RF mixer apparatus 100 further shows a second commutator cell impedance 140, or $Z_{in3}$, looking into the third commutator cell 128 and seen by the third transformer 122, which is a 1:1 transformer, across its primary 122a terminals.

In operation, an RF input signal (not shown) is split by the first transformer 118, the second transformer 120 and the third transformer 122 and fed to the first commutator cell 124, the second commutator cell 126 and the third commutator cell 128. The first commutator cell 124, the second commutator cell 126 and the third commutator cell 128 are driven by the LO input terminal 104. The first commutator cell 124, the second commutator cell 126 and the third commutator cell 128 each have a bias current from the first current source 130, the second current source 132 and the third current source 134 shown as $I_1$, $I_2$ and $I_3$ in FIG. 5. In one example, $I_1$, $I_2$, and $I_3$ are equal and are each one third of the total commutator cell DC. In another example, $I_1$, $I_2$, and $I_3$ are substantially equal and are each approximately one third of the total commutator cell DC. As used herein, "substantially" and "approximately" will be understood by persons of ordinary skill in the art and will vary to some extent on the context in which they are used. If there are uses of this term which are not clear to persons of ordinary skill in the art given the context in which they are used, "substantially" and "approximately" will mean plus or minus 10% of the particular term. The RF input signal is down-converted to a desired IF signal. The outputs of the first commutator cell 124, the second commutator cell 126 and the third commutator cell 128 are connected in parallel combining the currents of the first commutator cell 124, the second commutator cell 126 and the third commutator cell 128.

In one example, the architecture of the active RF mixer 100 apparatus simultaneously provides improved power handling and improved impedance matching compared to conventional active RF mixers including the PRIOR ART mixers 10, 30 and 50. In one example, the architecture allows the active RF mixer 100 apparatus to operate with larger DC while increasing the input intercept point (IIP3) and the 1 dB compression point (P1 dB). The IIP3 represents how efficiently an active RF mixer processes signals without distortion. In other words, the IIP3 is a figure of merit for a RF/microwave radio component. The IIP3 also represents how much of a range, for example, power in milliwatts or dBms, that the component is able to suitably process without distortion. The P1 dB is defined as the input power at which the insertion loss has increased by 1 dB from its low-power value. In other words, the P1 dB is a measure of the amount of power that can be input to the active RF mixer at the input port before the output power deviates from a linear relationship with the input power by 1 dB.

More specifically, and in one example, the improved power handling and improved impedance matching is accomplished by splitting the total DC (I) equally (I/3), or substantially equally, between the first commutator cell 124, the second commutator cell 126 and the third commutator cell 128. An RF source impedance 125, or $Z_S$, is presented to the RF input terminal 102. The total commutator cell impedance, which is the sum of the first commutator cell impedance the second commutator cell impedance $Z_{in2}$ and the third commutator cell impedance $Z_{in3}$, is matched, or substantially matched, to the RF source impedance $Z_S$. In one example, the individual commutator cell impedance (a) is three times, or approximately three times, greater than the total commutator cell impedance of the PRIOR ART active RF mixers 10, 30 and 50. The RF impedances of each commutator cell 124, 126 and 128 are additively summed at the RF input terminal 102 by 1:1 transformers 118, 120 and 122 whose primaries 118a, 120a, and 122a are connected in series which provides a total RF impedance that is nine times, or approximately nine times, greater than the RF impedances presented by the PRIOR ART active RF mixers 10, 30 and 50. The impedance transformation is accomplished, at least in part, by current splitting between three commutator cells and using 1:1 transformers. A 1:1 transformer has a stronger magnetic coupling factor k with equal primary and secondary turns compared to other transformers, such as a 1:4 transformer. This minimizes leakage flux present in 1:1 transformers and also yields low-loss with improved passive transformation efficiency and broadband matching. Further, the linearity of the active RF mixer apparatus 100 is improved by operating in a higher DC range compared to conventional active RF mixers.

Figure 6:
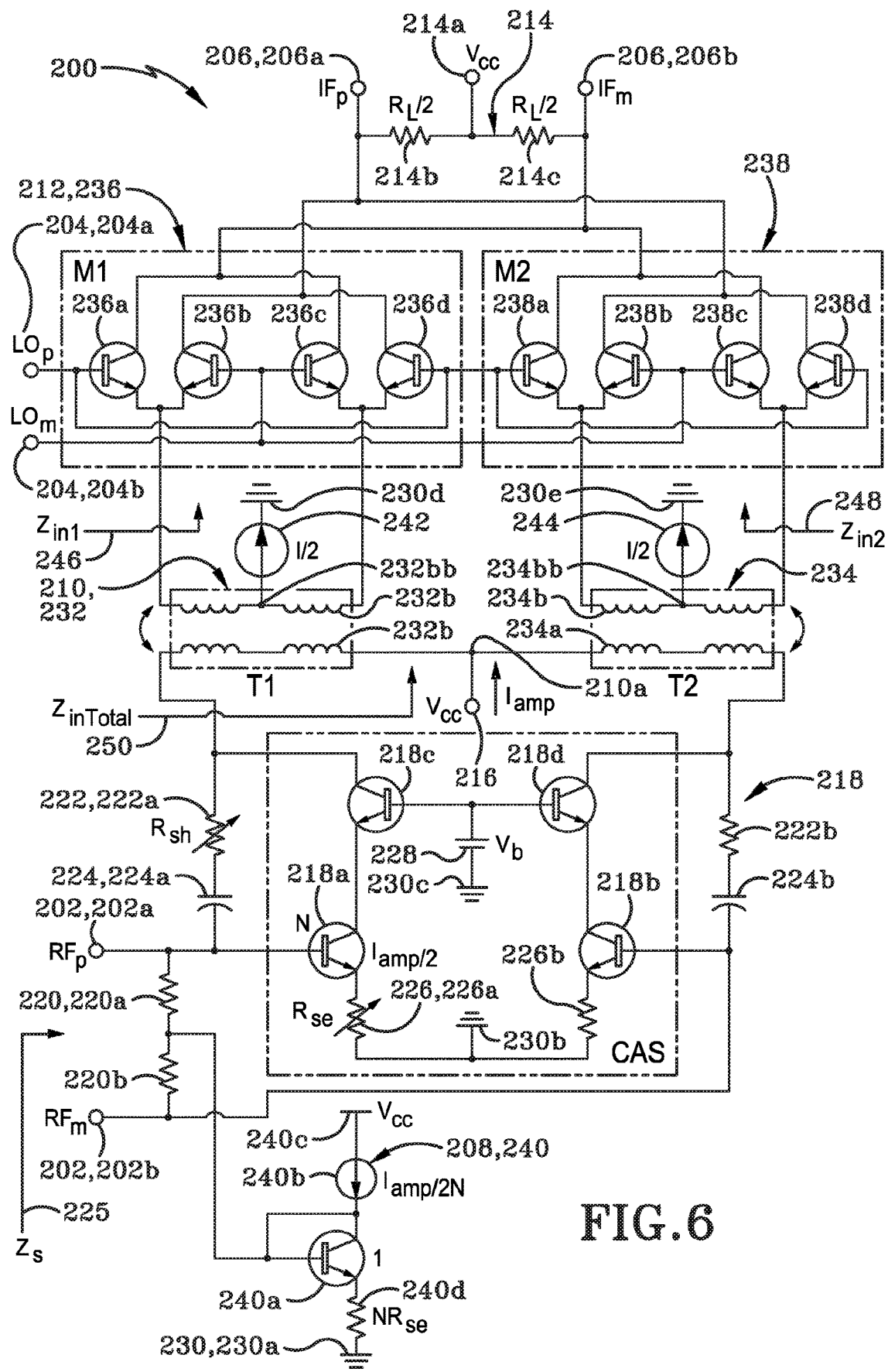
FIG. 6 is a schematic diagram of one embodiment of an active RF mixer apparatus in accordance with one aspect of the present disclosure.

FIG. 6 is a schematic view of one embodiment of an active RF mixer apparatus 200 in accordance with one aspect of the present disclosure. The active RF mixer apparatus 200 may include a differential voltage RF input terminal 202 having a first RF input terminal 202a and a second RF input terminal 202b, a differential voltage local oscillator (LO) input terminal 204 having a first LO input terminal 204a and a second LO input terminal 204b, a differential IF output terminal 206 having a first IF output terminal 206a and a second IF output terminal 206b, at least one current source 208, at least two transformers 210, at least two mixing mechanisms 212, which may also be referred to as commutator switching cores, mixer cores, commutating quads, mixing quads or quad cores, a load mechanism 214, at least one voltage supply 216, an amplifier mechanism 218, at least one isolation resistor 220, at least one shunt resistor 222, at least one shunt capacitor 224, at least one emitter resistor 226, a voltage bias circuit 228 and at least one ground 230.

In one particular embodiment, the active RF mixer apparatus 200 may include a first ground 230a, a second ground 230b, a third ground 230c, a fourth ground 230d and a fifth ground 230e.

In one particular embodiment, the active RF mixer apparatus 200 may include a first transformer 232 and a second transformer 234. The first transformer 232 may include a primary 232a and a secondary 232b which includes a center tap 232bb. The second transformer 234 may include a primary 234a and a secondary 234b which includes a center tap 234bb. In one example, the first transformer 232 and the second transformer 234 are 1:1 planar transformers; however, any suitable transformers may be utilized.

In one particular embodiment, the active RF mixer apparatus 200 may include a first commutator cell 236 and a second commutator cell 238. The first commutator cell 236 may include a first transistor 236a, a second transistor 236b, a third transistor 236c and a fourth transistor 236d. The second commutator cell 238 may include a first transistor 238a, a second transistor 238b, a third transistor 238c and a fourth transistor 238d. In one example, the first commutator cell 236 and the second commutator cell 238 may be a bipolar junction transistor mixer; however the first commutator cell 236 and the second commutator cell 238 may be any suitable mixing mechanism. Further, the first commutator cell 236 and the second commutator cell 238 may utilize any suitable transistors including, but not limited to, bipolar transistors, n-type field effect transistors (nFETs), pseudomorphic high-electron mobility transistors (pHEMTs), metal-semiconductor field-effect transistors (MESFETs) and gallium nitride (GaN) transistors.

The load mechanism 214 may include a voltage supply 214a, a first resistor 214b and a second resistor 214c. Although not shown, it is envisioned that the load mechanism 214 may further include a first pull-up inductor and a second pull-up inductor.

In one particular embodiment, the active RF mixer apparatus 200 may include a first current source 240, a second current source 242 and a third current source 244. The first current source 240 may be a current mirror including a diode connected transistor 240a, a reference current 240b and a voltage supply 240c. The reference current 240b is scaled ($I_{amp}/2N$) to represent the transistor size ratio 1:N between the diode connected transistor 240a, the first transistor 218a and the second transistor 218b. The diode connected transistor 240a may include an emitter resistor 240d, or $NR_{se}$, connected to ground 230a.

In one particular embodiment, the active RF mixer apparatus 200 may include a first isolation resistor 220a and a second isolation resistor 220b.

In one particular embodiment, the active RF mixer apparatus 200 may include a first shunt resistor 222a, a second shunt resistor 222b, a first shunt capacitor 224a and a second shunt capacitor 224b.

In one particular embodiment, the active RF mixer apparatus 200 may include a first emitter resistor 226a and a second emitter resistor 226b.

In one particular embodiment, the amplifier mechanism 218 may include a first transistor 218a, a second transistor 218b, a third transistor 218c and a fourth transistor 218d. The first transistor 218a and the third transistor 218c may be a common-base transistor pair and the second transistor 218b and the fourth transistor 218d may be a common-emitter transistor pair.

In one particular embodiment, the amplifier mechanism 218 may be a series-shunt feedback amplifier formed by the first shunt resistor 222a the second shunt resistor 222b, the first shunt capacitor 224a, the second shunt capacitor 224b, the first emitter resistor 226a and the second emitter resistor 226b; however, the amplifier mechanism 218 may be any suitable amplifier mechanism.

In one example, the first RF input terminal 202a is connected to the base of the first transistor 218a. The second RF input terminal 202b is connected to the base of the second transistor 218b. The first isolation resistor 220a and the second isolation resistor 220b may be connected across the differential RF input terminal 202. The first current source 240 may be connected between the first isolation resistor 220a and the second isolation resistor 220b and to the first ground 230a.

The emitter of the first transistor 218a is connected to the emitter of the second transistor 218b and the second ground 230b and the emitter of the second transistor 218b is connected to the second ground 230b. The collector of the first transistor 218a is connected to the emitter of the third transistor 218c. The collector of the second transistor 218b is connected to the emitter of the fourth transistor 218d. The base of the third transistor 218a is connected to the base of the fourth transistor 218d and the voltage bias circuit 228. The voltage bias circuit 228 is connected to the third ground 230c. The collector of the third transistor 218c is connected to the primary 232a of the first transformer 232 and the first shunt resistor 222a. The first shunt capacitor 224a is connected to the first shunt resistor 222a and the base of the second transistor 218b. The collector of the fourth transistor 218d is connected to the primary 234a of the second transformer 234 and the second shunt resistor 222b. The second shunt capacitor 224b is connected to the second shunt resistor 222b and the base of the second transistor 218b.

In one particular embodiment, the primary 232a of the first transformer 232 is connected to the primary 234a of the second transformer 234 in series. The voltage supply 216 is connected between the primary 232a of the first transformer 232 and the primary 234a of the second transformer 234 at a primary tap 210a to provide a voltage to the amplifier mechanism 218.

The secondary 232b of the first transformer 232 is connected to the emitters of the first transistor 236a, the second transistor 236*b*, the third transistor 236*c* and the fourth transistor 236*d* of the first commutator cell 236 and the second current source 242 via center tap 236*bb*. The second current source 242 is connected to the fourth ground 230*d*. The first transistor 236*a* and the second transistor 236*b* are a cross-coupled pair of transistors. The emitter of the first transistor 236*a* is connected to the emitter of the second transistor 236*b*. The third transistor 236*c* and the fourth transistor 236*d* are a cross-coupled pair of transistors. The emitter of the third transistor 236*c* is connected to the emitter of the fourth transistor 236*d*. The base of the first transistor 236*a* is connected to the base of the fourth transistor 236*d* and to the first LO input terminal 204*a*. The base of the second transistor 236*b* is connected to the base of the third transistor 236*c* and to the second LO input terminal 204*b*. The collector of the first transistor 236*a* is connected to the collector of the third transistor 236*c* and to the first IF output terminal 206*a*. The collector of the second transistor 236*b* is connected to the collector of the fourth transistor 236*d* and to the second IF output terminal 206*b*. The first resistor 214*b* is connected to the first IF output terminal 206*a* and the voltage supply 214*a*. The second resistor 214*c* is connected to the second IF output terminal 206*b* and the voltage supply 214*a*. The active RF mixer apparatus 200 further shows a first commutator cell impedance 246, or $Z_{in1}$, looking into the first commutator cell 236 and seen by the amplifier mechanism 218.

The secondary 234*b* of the second transformer 234 is connected to the emitters of the first transistor 238*a*, the second transistor 238*b*, the third transistor 238*c* and the fourth transistor 238*d* of the second commutator cell 238 and the third current source 244 via center tap 238*bb*. The third current source 244 is connected to the fifth ground 230*e*. The first transistor 238*a* and the second transistor 238*b* are a cross-coupled pair of transistors. The emitter of the first transistor 238*a* is connected to the emitter of the second transistor 238*b*. The third transistor 238*c* and the fourth transistor 238*d* are a cross-coupled pair of transistors. The emitter of the third transistor 238*c* is connected to the emitter of the fourth transistor 238*d*. The base of the first transistor 238*a* is connected to the base of the fourth transistor 238*d* and to the first LO input terminal 204*a* in parallel. The base of the second transistor 238*b* is connected to the base of the third transistor 238*c* and to the second LO input terminal 204*b* in parallel. The collector of the first transistor 238*a* is connected to the collector of the third transistor 238*c* and to the first IF output terminal 206*a* in parallel. The collector of the second transistor 238*b* is connected to the collector of the fourth transistor 238*d* and to the second IF output terminal 206*b* in parallel. The active RF mixer apparatus 200 further shows a second commutator cell impedance 248, or $Z_{in2}$, looking into the second commutator cell 238 and seen by the amplifier mechanism 218. The active RF mixer apparatus 200 further shows a total commutator cell impedance 250, or $Z_{inTotal}$, which is the sum of the first commutator cell impedance $Z_{in1}$ and the second commutator cell impedance $Z_{in2}$, looking into the first commutator cell 236, the second commutator cell 238 and seen by the amplifier mechanism 218.

In operation, an RF input signal (not shown) is amplified by the amplifier mechanism 218. The amplified RF signal is split by the first transformer 232 and the second transformer 234 and fed to the first commutator cell 236 and the second commutator cell 238. The first commutator cell 236 and the second commutator cell 238 are driven by the LO input terminal 204. The first commutator cell 236 and the second commutator cell 238 each operate at half, or approximately half, of the total mixer DCI using the second current source 242 and the third current source 244 shown as $I_2$ and $I_3$. The DC in each commutator cell 236 and 238 is half, or approximately half, of the total mixer DC which doubles, or approximately doubles, the RF impedance of each cell 236 and 238. The series connection of each cell 236 and 238 through the first transformer 232 and the second transformer 234 further doubles, or approximately doubles, the RF impedance. Therefore, the RF impedance presented to the RF input terminal 202 is four times, or approximately four times, greater than the RF impedance of the PRIOR ART active RF mixers 10, 30 and 50. The RF input signal is down-converted to a desired IF signal. The outputs of the first commutator cell 236 and the second commutator cell 238 are connected in parallel combining the currents of the first commutator cell 236 and the second commutator cell 238. In one example, an RF source impedance 225, or $Z_S$, is presented to the RF input terminal 202. The total commutator cell impedance, which is the sum of the first commutator cell impedance $Z_{in1}$ and the second commutator cell impedance $Z_{in2}$ is matched, or substantially matched, to the RF source impedance $Z_S$.

In one example, the architecture of the active RF mixer 200 apparatus simultaneously provides improved power handling and improved impedance matching compared to conventional active RF mixers including the PRIOR ART mixers 10, 30 and 50. In one example, the architecture allows the active RF mixer 200 apparatus to operate with larger DC while increasing the IIP3 and the P1 dB. Further, the amplifier mechanism 218 of the RF mixer apparatus 200 may be operated on a low voltage supply. Further, the voltage supply 216 allows variation in the amount of current provided to the amplifier mechanism 218. In this embodiment, the output impedance of the amplifier mechanism 218 is matched, or substantially matched, to the total commutator cell impedance $Z_{inTotal}$ by selecting suitable values of the first shunt resistor 222*a*, the second shunt resistor 222*b*, the first emitter resistor 226*a* and the second emitter resistor 226*b*. The first shunt capacitor 224*a* and the second shunt capacitor 224*b* serve as DC blocks. The first shunt resistor 222*a* and the second shunt resistor 222*b* may be varied to tune the output impedance of the amplifier mechanism 218. Further, increasing the RF impedance of the first commutator cell 236 and the second commutator cell 238 at the RF input terminal 202 enables voltage feedback. In one example, variation of shunt resistors 222*a* and 222*b* and emitter resistors 226*a* and 226*b* may yield various gain values with no effect on the input and output impedances of the amplifier mechanism 218. In one example, the variation of the shunt resistors 222*a* and 222*b* and emitter resistors 226*a* and 226*b* may be simultaneous. Such flexibility of gain variation while preserving impedance is not taught or disclosed by the PRIOR ART mixers 10, 30 and 50.

Figure 7:
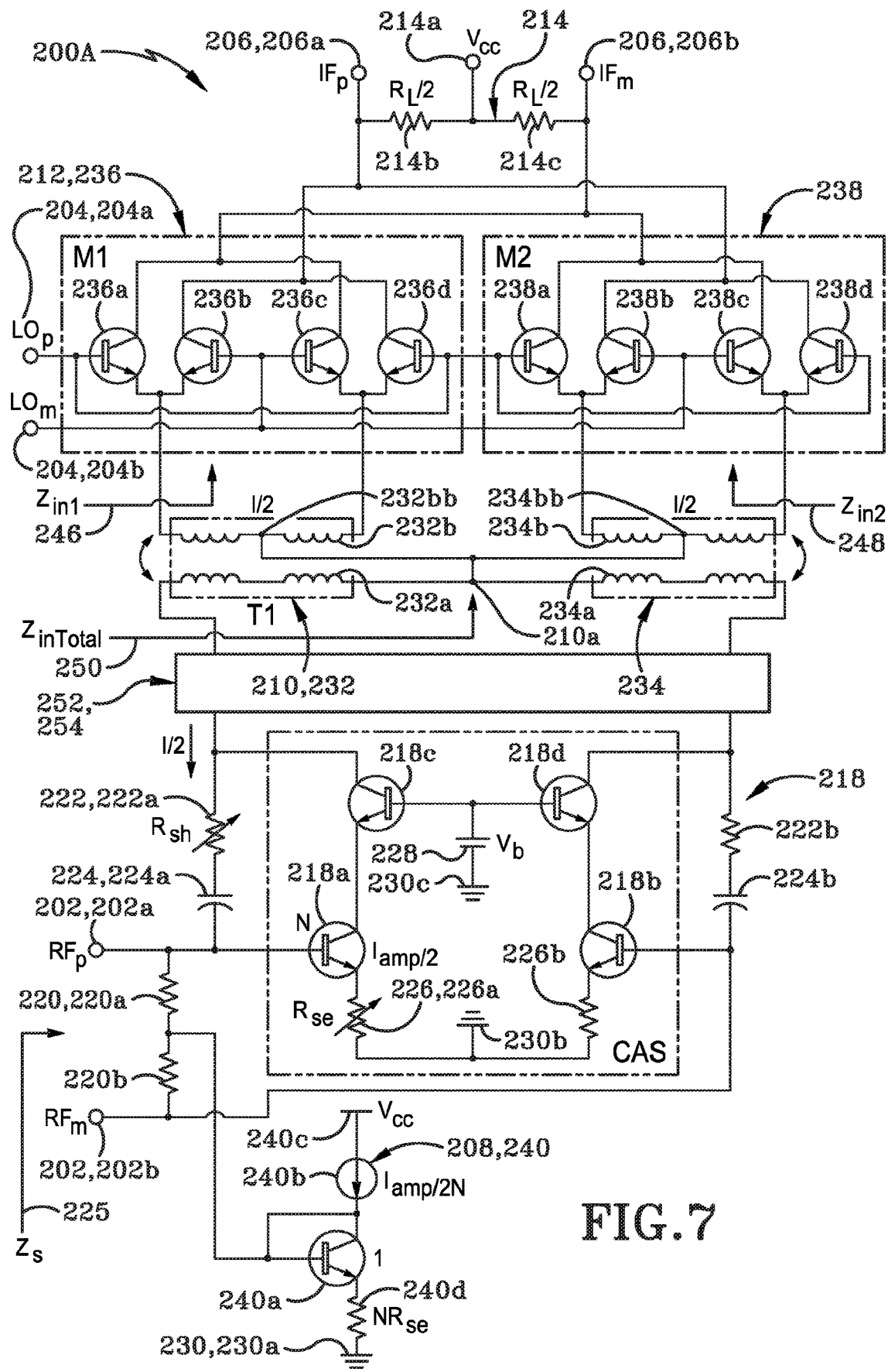
FIG. 7 is a schematic diagram of one embodiment of an active RF mixer apparatus in accordance with one aspect of the present disclosure.

FIG. 7 is a schematic view of one embodiment of an active RF mixer apparatus 200A in accordance with one aspect of the present disclosure. Active RF mixer apparatus 200A is substantially identical to active RF mixer apparatus 200 in structure and function with a few exceptions/additions that will be discussed hereafter in greater detail.

Figure 8:
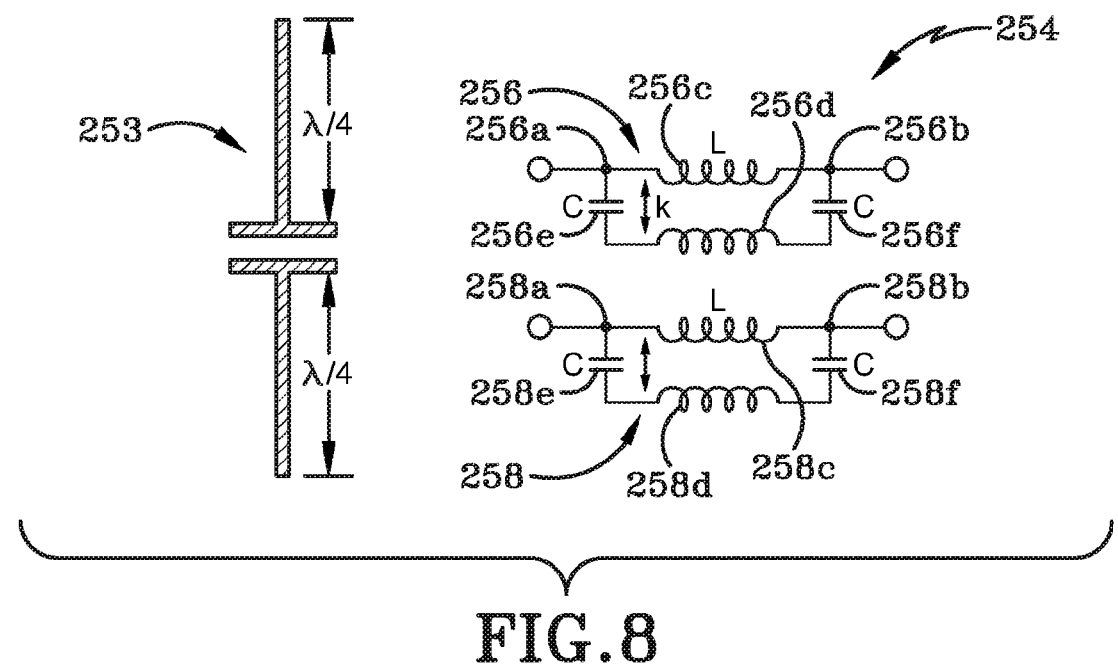
FIG. 8 is a cross-section view of a typical quarter-wave stub and a schematic diagram of a notch filter.

The active RF mixer apparatus 200A may further include a filter mechanism 252. In one example, the filter mechanism may be a quarter-wave stub 253 (FIG. 8) and a notch filter 254 (FIG. 8). The notch filter 254 may include a first portion 256 and a second portion 258. The first portion 256 may include a first node 256*a*, a second node 256*b*, a first inductor 256*c*, a second inductor 256*d*, a first capacitor 256*e* and a fourth capacitor 256*f*. The second portion 258 may include a first node 258a, a second node 258b, a first inductor 258c, a second inductor 258d, a first capacitor 258e and a fourth capacitor 258e.

Instead of the secondary 232b of the first transformer 232 being connected to the emitters of the first transistor 236a, the second transistor 236b, the third transistor 236c and the fourth transistor 236d of the first commutator cell 236 and the second current source 242 via center tap 232bb, the secondary 232b of the first transformer 232 is connected to the emitters of the first transistor 236a, the second transistor 236b, the third transistor 236c and the fourth transistor 236d of the first commutator cell 236 and to the primary tap 210a at the midpoint of the series connection of the primary 232a of the first transformer 232 and the primary 234a of the second transformer 234. This embodiment does not include the voltage supply 216 of the active RF mixer apparatus of 200 A.

Instead of the secondary 234b of the second transformer 234 being connected to the emitters of the first transistor 238a, the second transistor 238b, the third transistor 238c and the fourth transistor 238d of the second commutator cell 238 and the second current source 242 via center tap 234bb, the secondary 234b of the second transformer 234 is connected to the emitters of the first transistor 238a, the second transistor 238b, the third transistor 238c and the fourth transistor 238d of the second commutator cell 238 and to the primary tap 210a at the midpoint of the series connection of the primary 232a of the first transformer 232 and the primary 234a of the second transformer 234.

Instead of the collector of the third transistor 218c being connected to the primary 232a of the first transformer 232 and the first shunt resistor 222a, the collector of the third transistor 218c is connected to the first node 256a of the first portion 256 of the notch filter 254 and the first shunt resistor 222a. The primary 232a of the first transformer 232 is connected to the second node 256b of the first portion 256 of the notch filter 254.

Figure 9:
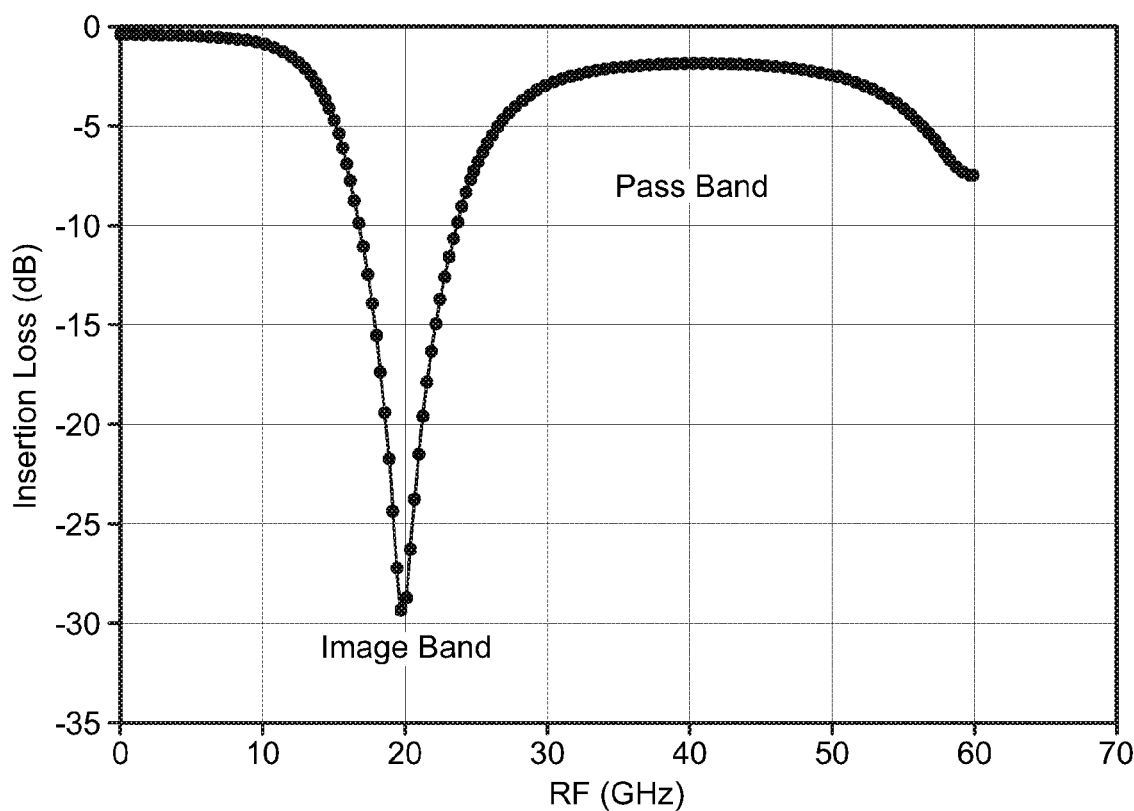
FIG. 9 is a graph of an exemplary image band and pass band of the notch filter.

Instead of the collector of the fourth transistor 218d being connected to the primary 234a of the second transformer 234 and the second shunt resistor 222b, the collector of the fourth transistor 218d is connected to the first node 258a of the second portion 258 of the notch filter 254 and the second shunt resistor 222b. The primary 234a of the second transformer 234 is connected to the second node 258b of the second portion 258 of the notch filter 254. Further, the voltage supply 216 has been removed. FIG. 9 depicts an exemplary image band and pass band of the notch filter 254.

In operation, the active RF mixer apparatus 200A operates in a substantially identical manner to active RF mixer apparatus 200, except that the amplifier mechanism 218 of the active RF mixer apparatus 200A receives supply a voltage through the primary tap 210a allowing the amplifier mechanism 218 to use the total commutator cell current through the primary tap 210a and the active RF mixer apparatus 200A has a further reduction in the noise figure compared to the active RF mixer apparatus 200. Impedance matching, or substantially impedance matching, the amplifier mechanism 218 to the total commutator cell impedance $Z_{inTotal}$ increases the amplifier gain ($G_{amp}$). This allows the noise reduction as described in greater detail herein. The contribution of the first commutator cell 236 and the second commutator cell 238 to the noise figure is reduced by the increased gain of the amplifier mechanism 218 in accordance with the Friis Formula:

$$F_T = F_{amp} + \frac{F_{mix} - 1}{G_{amp}}. \quad \text{Equation (2)}$$

As stated above, the noise figure reduction is accomplished, at least in part, by the impedance transformation of the commutating elements (i.e. the first commutator cell 236 and the second commutator cell 238) to the amplifier mechanism 218. The noise figure is further reduced by filtering the image noise amplified by the amplifier mechanism 218. In one example, at millimeter-wave frequencies, open half-wave length stubs may be used. Impedance band stop filters may also be added or inserted at the output of the amplifier mechanism 218. In one example, at millimeter-wave frequencies, miniature coupled split resonators may be used. At higher RF and microwave frequencies, transformer coupled filters may be used. The noise figure of the active RF mixer apparatus may be reduced by as much as 3 dB when compared to conventional RF mixers including the PRIOR ART Gilbert cell mixer 10.

In one exemplary implementation of the active RF mixer apparatus 200A, the first commutator cell 236 and the second commutator cell 238 may be connected with the amplifier mechanism 218 designed as a cascode amplifier. In this exemplary implementation, the first commutator cell 236 and the second commutator cell 238 provide a gain of −2.5 dB with a noise figure of 10 dB. The first and second shunt resistor 222a and 222b of the cascode amplifier may have a value of 800 and the first and second emitter resistor 226a and 226b may have a value of 2 to provide a gain of 12 dB with a noise figure of 2.6 dB. Therefore, the overall noise figure in terms of gain $G_{amp}$ and noise factor $F_{mix}$—is provided by Equation 2 and is equal to 3.8 dB. However, without rejection of the image noise, the value is equal to 3.8 plus 3 which is equal to 6.8 dB. Therefore, any rejection of the image noise will reduce the overall noise contributed by the mixing process. If IR is the image noise rejection in dB, then the noise figure degradation can be expressed as follows:

$$NF_{DG} = \left[10\log_{10}\left(1 + 10^{\frac{-IR}{10}}\right)\right]dB. \quad \text{Equation (3)}$$

Figure 10:
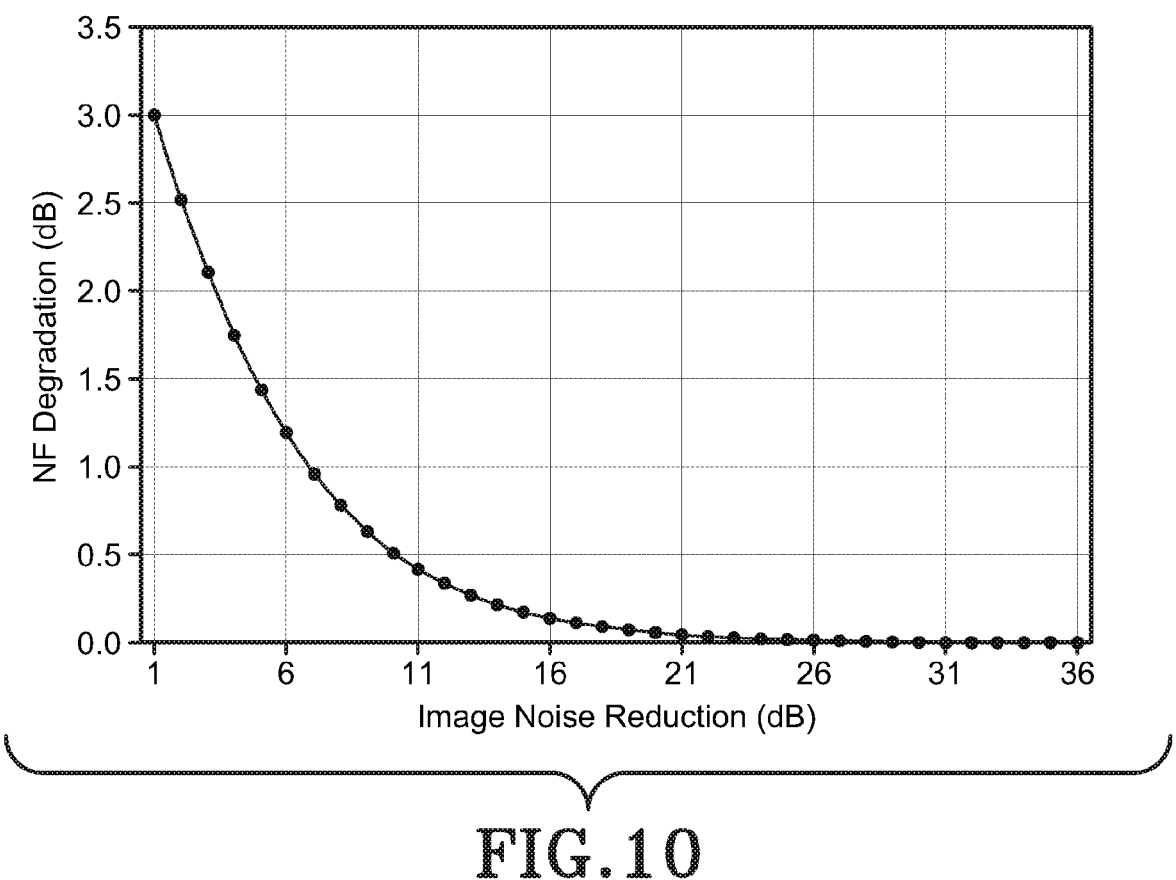
FIG. 10 is a graph of noise figure degradation in decibels (dB) as a function of image noise rejection in dB.

With no rejection of the image noise into the mixing element (i.e. the first commutator cell 236 and the second commutator cell 238), the noise figure degrades by 3 dB. In one example, an exemplary transformer notch (one stage) and a quarter-wave microstrip stub may be utilized to realize 15 dB of image noise rejection. In accordance with Equation (3), the noise figure of the amplifier mechanism 218 and the at least two mixing mechanisms 212 cascade degrades by 0.14 dB. The cascade noise figure is 3.8+0.14=3.94 dB. With improved power gain and reduced noise figure accomplished by techniques as described herein, a low-noise-amplifier (LNA) function may be replaced within the modified Gilbert cell mixer structure. FIG. 10 depicts noise figure degradation in dB as a function of image noise reduction in dB.

Figure 11:
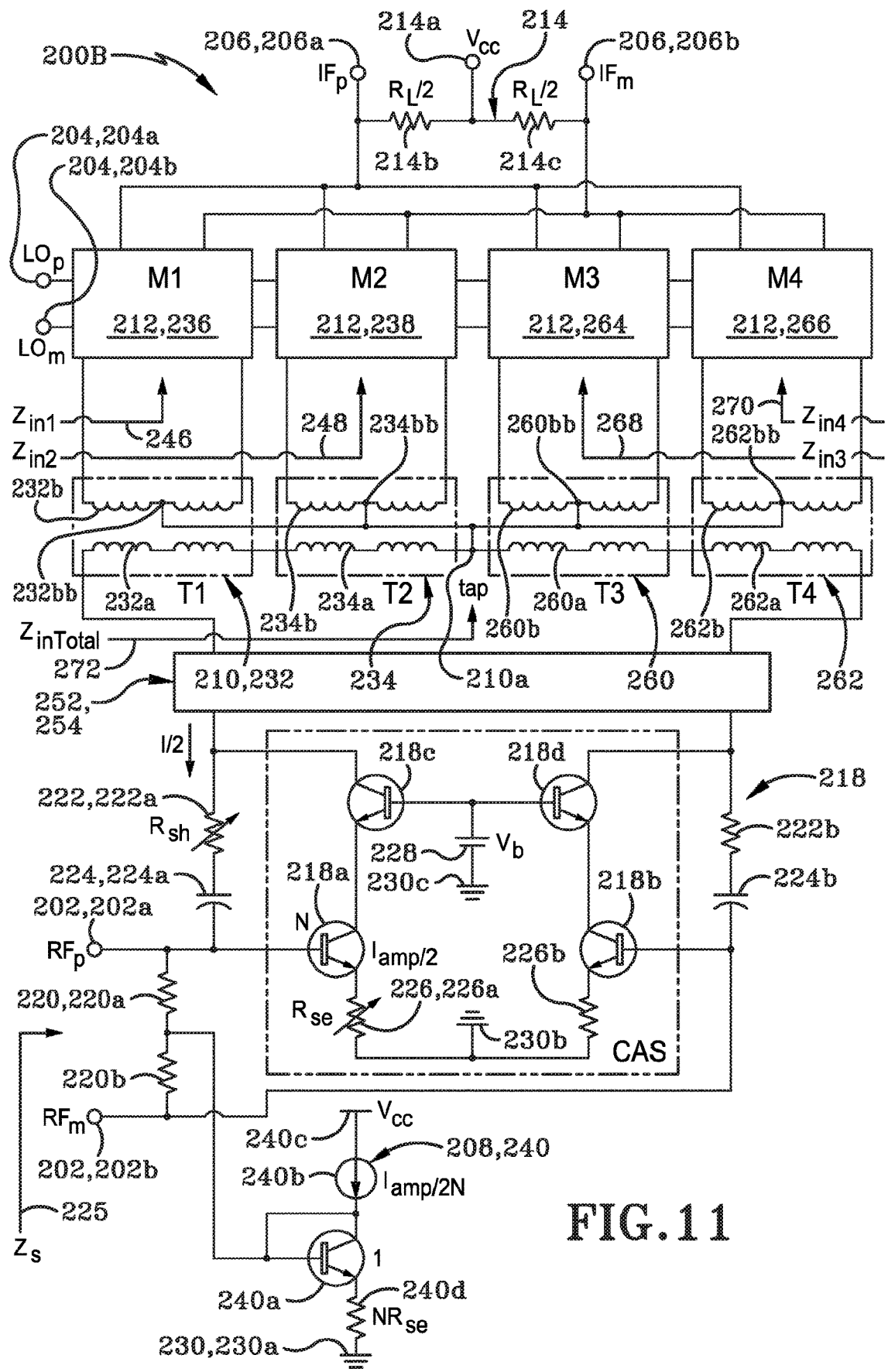
FIG. 11 is a schematic diagram of one embodiment of an active RF mixer apparatus in accordance with one aspect of the present disclosure.

FIG. 11 is a schematic view of one embodiment of an active RF mixer apparatus 200B in accordance with one aspect of the present disclosure. Active RF mixer apparatus 200B is substantially identical to active RF mixer apparatus 200A in structure and function with a few exceptions/additions that will be discussed hereafter in greater detail.

In this embodiment, the active RF mixer 200B may include a third transformer 260 and a fourth transformer 262.

The third transformer 260 may include a primary 260a and a secondary 260b which includes a center tap 260bb. The fourth transformer 262 may include a primary 262a and a secondary 262b which includes a center tap 262bb.

In this embodiment, the active RF mixer 200B may include a third commutator cell 264 and a fourth commutator cell 266. The third commutator cell 264 may include a first transistor, a second transistor, a third transistor and a fourth transistor each of which are not shown but are substantially identical to the first transistor 236a, a second transistor 236b, a third transistor 236c and a fourth transistor 236d, respectively, of the first commutator cell 236 in structure and function. The fourth commutator cell 266 may include a first transistor, a second transistor, a third transistor and a fourth transistor each of which are not shown but are substantially identical to the first transistor 236a, a second transistor 236b, a third transistor 236c and a fourth transistor 236d, respectively, of the first commutator cell 236 in structure and function.

Instead of the primary 234a of the second transformer 234 being connected to the second node 258b of the second portion 258 of the notch filter 254, the primary 234a of the second transformer 234 is connected to the primary 260a of the third transformer 260 in series. The primary of the third transformer 260 is connected to the primary 262a of the fourth transformer 262 in series. The primary 262a of the fourth transformer 262 is connected to the second node 258b of the second portion 258 of the notch filter 254.

The secondary 260b of the third transformer 260 is connected to the emitters of the first transistor, the second transistor, the third transistor and the fourth transistor of the third commutator cell 264 and to the midpoint of the series connection of the primary 232a of the first transformer 232, the primary 234a of the second transformer 234, the primary 260a of the third transformer 260 and the primary 262a of the fourth transformer 262 via center tap 260bb.

The secondary 262b of the fourth transformer 262 is connected to the emitters of the first transistor, the second transistor, the third transistor and the fourth transistor of the fourth commutator cell 266 and to the midpoint of the series connection of the primary 232a of the first transformer 232, the primary 234a of the second transformer 234, the primary 260a of the third transformer 260 and the primary 262a of the fourth transformer 262 via center tap 262bb.

The connections of the transistors of the third commutator cell 264 and the connections of the transistors of the fourth commutator cell 266 are similar to the connections of the transistors 236a, 236b, 236c, and 236d of the first commutator cell and the transistors 238a, 238b, 238c and 238d of the second commutator cell 238, and, for brevity purposes, will not be described herein. As such the third commutator cell 264 and the fourth commutator cell 266 are connected to the first LO input terminal 204a in parallel, the second LO input terminal 204b in parallel, the first IF output terminal 206a in parallel and the second IF output terminal 206b in parallel. The active RF mixer apparatus 200B further shows a third commutator cell impedance 268, or $Z_{in3}$, looking into the third commutator cell 264 and seen by the amplifier mechanism 218 and a fourth commutator cell impedance 270, or $Z_{in4}$, looking into the fourth commutator cell 266 and seen by the amplifier mechanism 218 254. In this embodiment, the active RF mixer apparatus 200B further includes a total commutator cell impedance 272, or $Z_{inTotal}$ seen by the amplifier mechanism 218. $Z_{inTotal}$ is the sum of the first commutator cell impedance $Z_{in1}$, the second commutator cell impedance $Z_{in2}$, the third commutator cell impedance $Z_{in3}$ and the fourth commutator cell impedance $Z_{in4}$.

In operation, the active RF mixer apparatus 200B operates in a substantially identical manner to active RF mixer apparatus 200A, except that the impedance match value of the commutating elements (i.e. the first commutator cell 236, the second commutator cell 238, the third commutator cell 264 and the fourth commutator cell 266) and the amplifier mechanism 218 of the active RF mixer apparatus 200B will be different compared to the active RF mixer apparatus 200A. In one example, division of the total DC by a factor of four, or approximately four, and series impedance addition leads to an impedance increase that is sixteen times, or approximately sixteen times, greater compared to the impedances of the PRIOR ART active RF mixers 10, 30 and 50.

Figure 12:
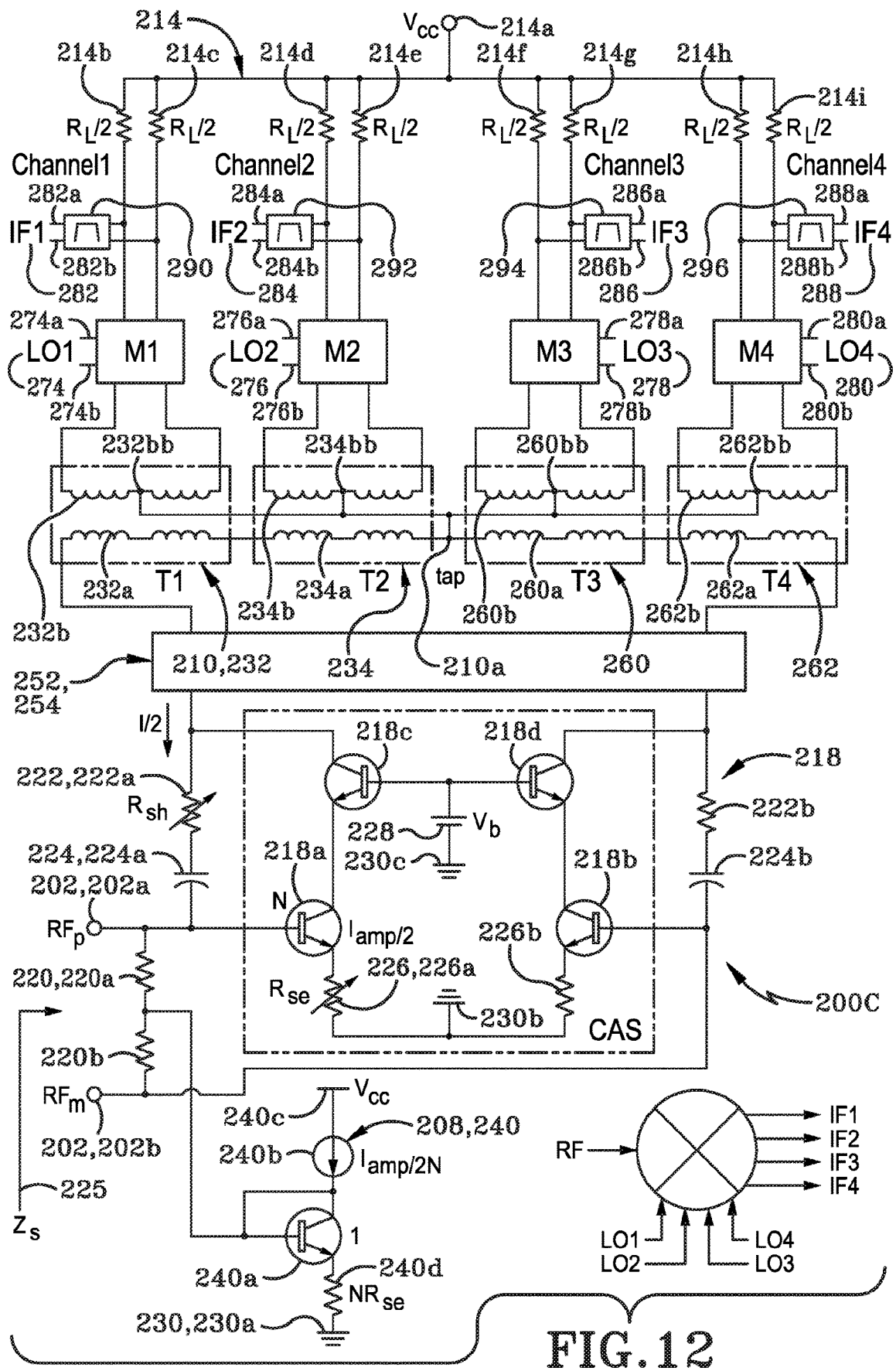
FIG. 12 is a schematic diagram of one embodiment of an active RF mixer apparatus in accordance with one aspect of the present disclosure.

FIG. 12 is a schematic view of one embodiment of an active RF mixer apparatus 200C in accordance with one aspect of the present disclosure. Active RF mixer apparatus 200C is substantially identical to active RF mixer apparatus 200B in structure and function with a few exceptions/additions that will be discussed hereafter in greater detail.

Instead of the first commutator cell 236, the second commutator cell 238, the third commutator cell 264 and the fourth commutator cell 266 being connected to the first LO input terminal 204a in parallel, the second LO input terminal 204b in parallel, the first IF output terminal 206a in parallel and the second IF output terminal 206b in parallel, each commutator cell 236, 238, 264 and 266 may be connected to separate differential LO terminals and separate differential IF terminals as discussed hereafter in greater detail.

In one particular embodiment, the active RF mixer apparatus 200C may include a first differential voltage LO input terminal 274 having a first LO input terminal 274a and a second LO input terminal 274b, a second differential voltage LO input terminal 276 having a first LO input terminal 276a and a second LO input terminal 276b, a third differential voltage LO input terminal 278 having a first LO input terminal 278a and a second LO input terminal 278b, and a fourth differential voltage LO input terminal 280 having a first LO input terminal 280a and a second LO input terminal 280b.

In one particular embodiment, the active RF mixer apparatus 200C may include a first differential voltage IF output terminal 282 having a first IF output terminal 282a and a second IF output terminal 282b, a second differential voltage IF output terminal 284 having a first IF output terminal 284a and a second IF output terminal 284b, a third differential voltage IF output terminal 286 having a first IF output terminal 286a and a second IF output terminal 286b, and a fourth differential voltage IF output terminal 288 having a first IF output terminal 288a and a second IF output terminal 288b.

In one particular embodiment, the load mechanism 214 of the active RF mixer apparatus 200C may include a voltage supply 214a, a first resistor 214b, a second resistor 214c, a third resistor 214d, a fourth resistor 214e, a fifth resistor 214f, a sixth resistor 214g, a seventh resistor 214h and an eighth resistor 214i.

In one particular embodiment, the active RF mixer apparatus 200C may include a first IF filter 290, a second IF filter 292, a third IF filter 294 and a fourth IF filter 296.

The first commutator cell 236 may be connected to the first LO input terminal 274a and the second LO input terminal 274b in a substantially identical manner to the connection of the first commutator cell 236 to the first LO input terminal 204a and the second LO input terminal 204b of active RF mixer apparatus 200. The first commutator cell 236 may be connected to the first IF output terminal 282a and the second IF output terminal 282b in a substantially identical manner to the connection of the first commutator cell 236 to the first IF output terminal 206a and the second IF output terminal 206b of active RF mixer apparatus 200 except that the first IF filter 290 is connected between the first commutator cell and the first IF output terminal 282a and the second IF output terminal 282b. The first resistor 214b is connected to the first IF filter 290 and the voltage supply 214a. The second resistor 214c is connected to the first IF filter 290 and the voltage supply 214a.

The second commutator cell 238 may be connected to the first LO input terminal 276a, the second LO input terminal 276b, the second IF filter 292, the first IF output terminal 284a and the second IF output terminal 284b in a substantially identical manner to the first commutator cell 236 of active RF mixer apparatus 200C. The third resistor 214d is connected to the second IF filter 292 and the voltage supply 214a. The fourth resistor 214e is connected to the second IF filter 292 and the voltage supply 214a.

The third commutator cell 266 may be connected to the first LO input terminal 278a, the second LO input terminal 278b, the third IF filter 294, the first IF output terminal 286a and the second IF output terminal 286b in a substantially identical manner to the first commutator cell 236 of active RF mixer apparatus 200C. The fifth resistor 214f is connected to the third IF filter 294 and the voltage supply 214a. The sixth resistor 214g is connected to the third IF filter 294 and the voltage supply 214a.

The fourth commutator cell 268 may be connected to the first LO input terminal 280a, the second LO input terminal 280b, the fourth IF filter 296, the first IF output terminal 288a and the second IF output terminal 288b in a substantially identical manner to the first commutator cell 236 of active RF mixer apparatus 200C. The seventh resistor 214h is connected to the fourth IF filter 296 and the voltage supply 214a. The eighth resistor 214i is connected to the fourth IF filter 296 and the voltage supply 214a.

In operation, the active RF mixer apparatus 200C operates in a substantially identical manner to active RF mixer apparatus 200B, except that the active RF mixer apparatus 200C operates as a multi-channel (frequency) device. More specifically, the first commutator cell 236, the second commutator cell 238, the third commutator cell 264 and the fourth commutator cell 266 are fed an amplified RF signal while being driven by separate LO terminals 274, 276, 278 and 280. The channels are separated at the IF output terminals 282, 284, 286 and 288 by the IF filters 290, 292, 294 and 296.

In accordance with one aspect of the present disclosure, exemplary circuit performance utilizing Jazz Semiconductor's 0.09 micron SiGe heterojunction bipolar transistor (HBT) is provided herein.

In one example, a single-cell (i.e. one commutator cell) broadband low power (i.e. 2V, 5 mA) active RF mixer exhibits a 5 dB conversion loss, a 9.0 dB noise figure with an input IIP3 of 3.2 dBm in the 20-50 GHz band. In order to improve the power handling of this RF mixer the DC may be increased through the mixer core as shown in FIG. 3. Increasing the mixer core current to 15 mA in a single cell mixer reduces the RF impedance to 12 which requires a 1:4 (i.e. 12Ω: 48Ω) transformation network to achieve a match to 50Ω. With idealized lossless 1:4 impedance matching, a single-cell mixer circuit yields a 2.7 dB conversion loss, a 9.2 dB noise figure and a 7.0 dBm IIP3.

In one example, if the same RF mixer utilizes a double-cell (i.e. two commutator cells) configuration instead of the single-cell configuration, the RF impedance for the same 15 mA RF mixer increases in two ways. With the double-cell configuration, the 15 mA is split into two 7.5 mA per cell which increases the RF impedance on a per cell basis (i.e. 24Ω per cell), and the RF impedance is doubled (i.e. 48Ω) as a result of input voltage splitting. A dual-cell broadband mixer with a 1:1 transformer yields a 2.5 dB conversion loss, a 10 dB noise figure with an input IP3 of 12 dBm in the 20-50 GHz band. As such, the RF impedance matching is more suitable. When the transformation ratio is 1:1, suitable bandwidth and suitable loss is achieved. When comparing the driver requirements of this configuration to the driver requirements of the PRIOR ART RF mixers 10, 30 and 50, driver requirements for the RF mixer in this configuration are improved. Assuming the PRIOR ART RF mixers 10, 30 and 50 have a 15 mA mixer core current with a 12 load line, in order to swing 1.5 V (750 mV per mixer core), a 125 mA current is required. Assuming the RF mixer has a double-cell configuration as provided herein, to achieve the full 3 V swing (1.5 V per mixer core; two mixer cores), with a 50 ohm load line, 60 mA is required. With a 3 V driver supply, the amplifier dissipation is reduced from 375 milliwatts (mW) to 180 mW.

In one example, high IIP3 (i.e. approximately 20 dBm) is achievable at millimeter wave frequencies using 50 mA in a low voltage RF mixer (FIG. 3), however, the RF input impedance is low (i.e. 6Ω). In order to impedance match the 6Ω to a 50Ω source, a transformation ratio greater than 8 would be necessary. In one example, if a triple-cell RF mixer configuration is utilized, and the RF mixer utilizes 16 mA per cell, a 45Ω impedance may be achieved (i.e. 15Ω at 16 mA×3) which provides a more suitable transformer implementation. A conversion gain of 1.5 dB with a 10.5 dB noise figure and +19 dBm IIP3 is demonstrated.

Table 1 presents exemplary active RF mixer designs in the 20-50 GHz range and includes the type of configuration (Con.), the current (Ic) in mA, the conversion loss (C.L.) in dB, the input impedance ($R_{in}$) in Ω, the IIP3 in dBm, and the noise figure NF in dB. Table 1 is shown below:

TABLE 1

Exemplary active RF mixer designs

| Con. | Ic | C.L. | Rin | IIP3 | NF |
|---|---|---|---|---|---|
| Single Cell | 5 | 5 | 36 | 3.2 | 9.0 |
| Single cell | 15 | 2.7 | 12 | 7.0 | 9.2 |
| Dual Cell | 2 × 7.5 | 2.5 | 2 × 24 | 12 | 10 |
| Triple cell | 3 × 16 | −1.5 (Gain) | 45 | 19 | 10.5 |
| Four Cell | 4 × 20 | 0.7 | 40 | 26 | 10.2 |

In accordance with one aspect of the present disclosure, it is envisioned that the low-power, high dynamic range active RF mixers 200, 200A, 200B and 200C of the present disclosure may be utilized for, inter alia, radar applications and 5th generation mobile networks or 5th generation wireless systems (5G) applications operating at extremely high frequency (EHF) (i.e. radio frequencies in the electromagnetic spectrum from 30 to 300 gigahertz (GHz)) which includes millimeter-wave frequencies. In one example, the active RF mixers 200, 200A, 200B and 200C of the present disclosure use multiple active cells to impedance match, or substantially impedance match, the mixing and amplification function within the conventional Gilbert cell mixer. By solving the impedance mismatch issue using current splitting between n active mixer cells and summing up the individual cell impedances, multiple impedance matched, or substantially impedance matched, configurations may be available. As such, low voltage impedance matched, or substantially impedance matched, active transformer coupled RF mixer topologies with high linearity are described herein. The present disclosure also addresses combining impedance matched, or substantially impedance matched, amplifier and mixer configurations with current reuse, gain variation, image filtering, and multi-channel capabilities as described above.

It is further envisioned that the active RF mixers 200, 200A, 200B and 200C may be configured in any suitable manner, including, but not limited to, adding or removing transformers and commutator cells as necessary and depending on the desired design choice (e.g. a double-cell or triple-cell configuration).

It is further envisioned that the transformers of the active RF mixers 200, 200A, 200B and 200C may modify the total commutator cell impedance as desired.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. An RF mixer apparatus comprising:
    a plurality of transformers; wherein each of the plurality of transformers includes a primary and a secondary; wherein each primary is connected in series;
    a radio frequency (RF) input terminal, wherein a first transformer connected in series is connected to the RF input terminal;
    a plurality of commutator cells; wherein each of the plurality of commutator cells is coupled to a local oscillator (LO) port in parallel and an intermediate frequency (IF) port in parallel; and wherein each secondary is connected across one commutator cell of the plurality of commutator cells;
    an amplifier mechanism connected across the series connection of the primaries of the plurality of transformers;
    a primary tap; and
    a voltage supply connected to the primary tap to provide a voltage to the amplifier mechanism.

2. The RF mixer apparatus of claim 1, further comprising:
    a plurality of current sources providing a total commutator cell current to the plurality of commutator cells.

3. The RF mixer apparatus of claim 2, wherein the total commutator cell current is split substantially equally between the plurality of commutator cells.

4. The RF mixer apparatus of claim 3, further comprising:
    a total commutator cell impedance presented by the plurality of commutator cells, wherein the total commutator cell impedance is the sum of each commutator cell impedance of the plurality of commutator cells; and
    an RF source impedance of the RF input terminal; wherein the total commutator cell impedance is substantially matched to the RF source impedance.

5. The RF mixer apparatus of claim 4, wherein the plurality of transformers splits the total commutator cell impedance substantially equally between the plurality of commutator cells.

6. The RF mixer apparatus of claim 1, further comprising:
    a total commutator cell impedance presented by the plurality of commutator cells, wherein a plurality of current sources provides a total commutator cell current to the plurality of commutator cells, and wherein the total commutator cell current is split substantially equally between the plurality of commutator cells to provide each commutator cell impedance, and wherein the total commutator cell impedance is the sum of each commutator cell impedance of the plurality of commutator cells; and an output impedance of the amplifier mechanism; wherein the total commutator cell impedance is substantially matched to the output impedance.

7. The RF mixer apparatus of claim 1, further comprising:
a center-tapped secondary of each of the plurality of transformers; and
a primary tap; wherein each center-tapped secondary of the plurality of transformers is connected to the primary tap to supply a voltage to the amplifier mechanism; and wherein the amplifier mechanism uses the total commutator cell current through the primary tap.

8. The RF mixer apparatus of claim 1, further comprising:
a filter mechanism connected to the plurality of commutator cells and the amplifier mechanism.

9. The RF mixer apparatus of claim 1, wherein the amplifier mechanism is a series-shunt feedback amplifier configured to provide a variable gain.

10. An RF mixer apparatus comprising:
a plurality of transformers; wherein each of the plurality of transformers includes a primary and a secondary; wherein each primary is connected in series;
a plurality of commutator cells; wherein each of the plurality of commutator cells is respectively coupled to a local oscillator (LO) port; wherein each of the plurality of commutator cells is respectively coupled to an intermediate frequency (IF) port; wherein each secondary is connected across one commutator cell of the plurality of commutator cells;
a plurality of IF filters respectively connected between each of the plurality of commutator cells and each of the respective IF ports;
an amplifier mechanism connected across the series connection of the primaries of the plurality of transformers; and
a filter mechanism connected to the plurality of commutator cells and the amplifier mechanism.

11. The RF mixer apparatus of claim 10, wherein the amplifier mechanism is a series-shunt feedback amplifier configured to provide a variable gain.

12. The RF mixer apparatus of claim 10, further comprising:
at least one current source providing a total commutator cell current to the plurality of commutator cells.

13. The RF mixer apparatus of claim 12, wherein the total commutator cell current is split substantially equally between the plurality of commutator cells.

14. The RF mixer apparatus of claim 12, further comprising:
a center-tapped secondary of each of the plurality of transformers; and
a primary tap; wherein each center-tapped secondary of the plurality of transformers is connected to the primary tap to supply a voltage to the amplifier mechanism; and wherein the amplifier mechanism uses the total commutator cell current through the primary tap.

15. The RF mixer apparatus of claim 10, further comprising:
a total commutator cell impedance presented by the plurality of commutator cells, wherein a plurality of current sources provides a total commutator cell current to the plurality of commutator cells, and wherein the total commutator cell current is split substantially equally between the plurality of commutator cells to provide each commutator cell impedance, and wherein the total commutator cell impedance is the sum of each commutator cell impedance of the plurality of commutator cells; and
an RF source impedance of an RF input terminal; wherein the total commutator cell impedance is substantially matched to the RF source impedance.

16. The RF mixer apparatus of claim 15, wherein the plurality of transformers splits the total commutator cell impedance substantially equally between the plurality of commutator cells.

17. The RF mixer apparatus of claim 10, further comprising:
a total commutator cell impedance presented by the plurality of commutator cells, wherein a plurality of current sources provides a total commutator cell current to the plurality of commutator cells, and wherein the total commutator cell current is split substantially equally between the plurality of commutator cells to provide each commutator cell impedance, and wherein the total commutator cell impedance is the sum of each commutator cell impedance of the plurality of commutator cells; and
an output impedance of the amplifier mechanism; wherein the total commutator cell impedance is substantially matched to the output impedance.

* * * * *